(12) United States Patent
Toyonaga et al.

(10) Patent No.: US 6,532,581 B1
(45) Date of Patent: Mar. 11, 2003

(54) METHOD FOR DESIGNING LAYOUT OF SEMICONDUCTOR DEVICE, STORAGE MEDIUM HAVING STORED THEREON PROGRAM FOR EXECUTING THE LAYOUT DESIGNING METHOD, AND SEMICONDUCTOR DEVICE

(75) Inventors: Masahiko Toyonaga, Hyogo (JP); Kazuo Tsuzuki, Aichi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/345,485

(22) Filed: Jul. 1, 1999

(30) Foreign Application Priority Data

Jul. 3, 1998 (JP) .......................... 10-188696

(51) Int. Cl.$^7$ .............................. G06F 17/50
(52) U.S. Cl. .................. 716/11; 716/2; 716/12
(58) Field of Search .................. 716/11, 8, 9, 10, 716/12, 13, 14, 2

(56) References Cited

U.S. PATENT DOCUMENTS

| | | | | |
|---|---|---|---|---|
| 4,786,613 A | | 11/1988 | Gould et al. .................. 437/48 |
| 5,798,937 A | * | 8/1998 | Bracha et al. ............... 364/490 |
| 5,987,086 A | * | 11/1999 | Raman et al. .......... 395/500.02 |
| 6,031,981 A | * | 2/2000 | Lee et al. ............... 395/500.11 |
| 6,049,659 A | * | 4/2000 | Matsumoto et al. ... 395/500.02 |
| 6,075,934 A | * | 6/2000 | Chiluvuri et al. ...... 395/500.11 |
| 6,115,546 A | * | 9/2000 | Chevallier et al. ..... 395/500.06 |
| 6,209,123 B1 | * | 3/2001 | Maziasz et al. ................ 716/14 |

OTHER PUBLICATIONS

Apanovich Z.V. et al, "Top–Down Approach to Technology Migration for Full–Custom Mask Layouts," IEEE, 1997, pp. 48–52.*

Apannovich Z.V. et al, "DECOMp a Technology Migration Subsystem for Full Chip Mask Layouts," IEEE, Aug. 1997, pp. 942–945.*

Khoo et al, "An Efficient Multilayer MCM Router Based on Four–Via Routing," IEEE, Oct. 1995, pp. 1277–1290.*

J. Soukup, "Circuit Layout", Proceedings of the IEEE, vol. 69, No. 10, pp. 1281–1304, Oct. 1981.

* cited by examiner

Primary Examiner—Vuthe Siek
(74) Attorney, Agent, or Firm—Nixon Peabody LLP; Donald R. Studebaker

(57) ABSTRACT

A method for designing a layout of a semiconductor device includes the steps of: a) preparing a first layout corresponding to a first netlist and including a component layout and a number n of, or first to $n^{th}$ (where $n \geq 2$), interconnection planar layouts to be sequentially stacked on the component layout; b) receiving a second netlist, which is different from the first netlist; c) selecting at least one of the interconnection planar layouts from the first layout, the number of the interconnection planar layouts selected being equal to or smaller than n−1; and d) producing a second layout, corresponding to the second netlist, by changing the physical arrangement of the at least one interconnection planar layout selected, the second layout including the component layout, the at least one interconnection planar layout with the changed arrangement, and the other interconnection planar layouts that have not been selected from the first layout.

11 Claims, 22 Drawing Sheets

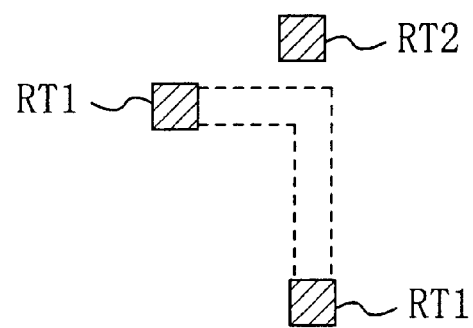
FIG. 22A
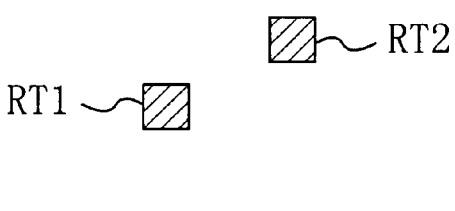
FIG. 22B
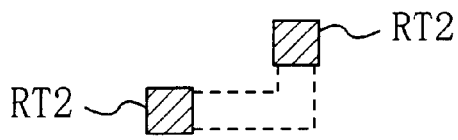
FIG. 22C

METHOD FOR DESIGNING LAYOUT OF SEMICONDUCTOR DEVICE, STORAGE MEDIUM HAVING STORED THEREON PROGRAM FOR EXECUTING THE LAYOUT DESIGNING METHOD, AND SEMICONDUCTOR DEVICE

BACKGROUND OF THE INVENTION

The present invention generally relates to a method for designing a layout of a semiconductor device. More particularly, the present invention relates to a method for designing a layout in such a manner as to make the layout of an interconnection structure easily changeable if the specifications of the device have been changed. The present invention also relates to a storage medium having stored thereon a program for executing such a layout designing method, and further relates to a semiconductor device with an easily modifiable interconnection structure.

As the functionality and performance of various microelectronic devices have been tremendously improved and as the size thereof has been drastically reduced over the past few years, the necessity of developing semiconductor devices for particular users (i.e., application specific integrated circuits (ASICs)) in a short time has been rapidly increasing. In order to further shorten the ASIC development time, IC's with various types of arrangements, e.g., gate-array types and embedded-gate-array types, have been provided. An arrangement of the gate-array type is partially incorporated into an IC with the embedded-gate-array-type arrangement.

In an IC with the gate-array-type arrangement, a logic circuit is formed to satisfy the specifications designated by a particular user by interconnecting or routing a plurality of gates arranged in advance to form an array as a master slice. According to this designing method, the user's designated specifications can be met only by designing the interconnection structure. Thus, it is possible to reduce the development cost and time.

In an IC with the embedded-gate-array-type arrangement, the gate-array-type arrangement is partially incorporated.

Depending on whether or not its specifications have been determined, functional circuits (also called simply "components" or "cells" are classified into the two categories of: a fixed circuit section (including fixed components or cells); and a non-fixed circuit section (including non-fixed components or cells). A standard-cell-type arrangement is applied to the fixed circuit section, while the gate-array-type arrangement is applied to the non-fixed circuit section. After the specifications of the non-fixed circuit section have been determined, the gates, which have been formed like an array in the non-fixed circuit section, are routed as per the specifications determined. According to this designing method, fixed circuit sections, such as memory sections, can be fixed before the layout designing is started. Thus, to finish the overall circuit design, the designer has only to design the non-fixed circuit section, thus further shortening the development time. In addition, since the fixed circuit section may be implemented as an arrangement of standard cells, the number of components or cells that can be integrated per unit area increases compared to an IC with the gate-array-type arrangement. In other words, the area of a chip required for integrating the same number of components can be reduced. An LSI of the embedded-gate-array type is disclosed in U.S. Pat. No. 4,786,613, for example.

The meanings of basic terms as used in this specification will be defined with reference to FIG. 20. A "layout" 900 defines a geometric or topographic arrangement for an LSI. The layout 900 for an LSI includes a component (or cell) layout 920 defining a functional circuit (or cell), and an interconnection layout 940 defining an "interconnection". The component layout 920 includes a plurality of component planar layouts 922, 923, 924, 925 and 926, which define n-well, active region, polysilicon layer, $p^+$-type doped region and $n^+$-type doped region, respectively. The interconnection layout 940 also includes a plurality of interconnection planar layouts 942, 943, 944 and 945, which define contact holes, first set of interconnection lines, through holes and second set of interconnection lines, respectively. The "interconnection" includes not only interconnection lines within a plane, but also interlayer connections by way of through holes (or via holes). In fabricating a semiconductor device by ordinary photolithographic processes, a number of masks, corresponding to respective planar layouts, are produced.

However, no matter whether an IC is designed using the gate-array-type or embedded-gate-array-type arrangement, the time taken to define the layout design continues to increase with the increasing number of gates or interconnection layers provided. In addition, the cost and time taken to produce a mask is also increasing with such a complication of physical circuit design. A mask used to produce a fine-line pattern (e.g., with a design rule of 0.25 μm or less), in particular, is much more expensive than a conventional mask (e.g., with a design rule of 0.35 μm or more). Furthermore, along with an increase in number of layers in a multilevel interconnection structure, the number of masks required for fabricating a single semiconductor device is also considerably increasing (e.g., 6 or more masks are needed recently). Accordingly, such an increase in cost and time taken to produce the masks can now be regarded as a main factor increasing the cost and time taken to develop a semiconductor device.

Hereinafter, a conventional method for designing a layout for an LSI will be described with reference to FIG. 21.

FIG. 21 is a flowchart illustrating a conventional method for designing a modified layout for an LSI, which has been once designed, but should have the circuit design (interconnection structure) thereof partially changed after that.

First, in Step S1700, a layout for the LSI is designed based on a netlist N1 representing interconnection information according to initial specifications. At this point in time, an initial layout is produced according to the initial specifications. If the design need not be changed, then the initial layout is output and a mask (exactly, a set of masks) is produced based on the initial layout. The set of masks includes a plurality of masks associated with respective planar layouts included in the initial layout.

Next, in Step S1710, a netlist N2 representing modified interconnection information is made to reflect the change in circuit design.

Then, in Step S1720, a new layout is designed for the LSI based on the netlist N2, thereby producing a modified layout according to the changed specifications. The modified layout is produced totally independent of the initial layout. For example, in an LSI with the gate-array-type arrangement, all the interconnections are rerouted.

Subsequently, in Step S1730, the modified layout, corresponding to the netlist N2, is output. And based on the modified layout output, the masks are produced again.

The prior art layout designing method, however, has the following drawbacks. Hereinafter, it will be described specifically what problems are caused if the conventional layout designing method shown in FIG. 21 is applied to an LSI with the gate-array-type arrangement.

When the layout of the LSI with the gate-array-type arrangement is modified based on the netlist N2 reflecting the changed specifications, all the interconnections are rerouted. Accordingly, the number of process steps and the number of masks, which are required for re-designing the layout, cannot be reduced. In other words, the time and cost taken to modify the layout cannot be reduced. If several masks have already been produced based on the initial layout when it turns out that the layout should be modified, then all of those masks should be discarded and new masks should be produced over again. Furthermore, if a wafer (i.e., a master slice) has already been introduced into the LSI production line at that point in time, then all the half-finished products should be thrown away.

For example, even when some minor changes should be made in input/output signal transmission lines or pull-up components for a power supply, all the masks associated with respective interconnection layers should be produced once again according to the conventional layout designing method. In general, the larger the number of circuits integrated on a single chip, the more likely the specifications are changed. Under the circumstances such as these, even if the design of a circuit has been changed only slightly, the cost and time taken to produce masks tremendously increase, thus causing a serious problem.

SUMMARY OF THE INVENTION

An object of the present invention is providing a layout designing method enabling a designer to develop a semiconductor device in a shorter period of time.

Another object of the present invention is providing a storage medium having stored thereon a program for executing such a layout designing method.

Still another object of the present invention is providing a semiconductor device that can be designed in a shorter period of time.

A method for designing a layout of a semiconductor device according to the present invention includes the steps of: a) preparing a first layout corresponding to a first netlist and including a component layout and a number n of, or first to $n^{th}$ (where $n \geq 2$), interconnection planar layouts to be sequentially stacked on the component layout; b) receiving a second netlist, which is different from the first netlist; c) selecting at least one of the interconnection planar layouts from the first layout, the number of the interconnection planar layouts selected being equal to or smaller than n−1; and d) producing a second layout, corresponding to the second netlist, by changing the physical arrangement of the at least one interconnection planar layout selected. The second layout includes the component layout, the at least one interconnection planar layout with the changed arrangement, and the other interconnection planar layouts that have not been selected from the first layout.

In one embodiment of the present invention, the method may further include, prior to the step a), the steps of: receiving the first netlist; and producing the first layout based on the first netlist. Each of the number n of interconnection planar layouts included in the first layout may have a plurality of redundant interconnection patterns that are separated from each other and not included in a first interconnection structure defined by the first netlist. In the step d), the second layout may be produced such that at least one of the redundant interconnection patterns of the interconnection planar layout selected is included in a second interconnection structure defined by the second netlist.

In another embodiment of the present invention, the component layout may define at least one standard cell.

In still another embodiment, the component layout may define a plurality of macroblocks.

In still another embodiment, one of the number n of interconnection planar layouts may be selected from the first layout in the step c).

In still another embodiment, the interconnection planar layout selected may be the $n^{th}$ interconnection planar layout.

In still another embodiment, a $k^{th}$ (where $1 \leq k \geq n$) interconnection planar layout may be selected in the step c) from the number n of interconnection planar layouts belonging to the first layout. In the step d), if the second layout is produced with the $k^{th}$ interconnection planar layout changed, then information representing k and the second layout may be output. Alternatively, if the second layout is produced with the $k^{th}$ interconnection planar layout not changed, then the steps c) and d) may be repeatedly performed by substituting k−1 for k until k becomes equal to one.

In still another embodiment, the method may further include the steps of: performing the step c) for all the possible combinations; performing the step d) for all the possible combinations obtained in the step c); and outputting a second layout set including information specifying the at least one interconnection planar layout selected and the second layout corresponding to the planar layout for each of the possible combinations.

A computer readable storage medium according to the present invention has stored thereon a program executable in a computer for performing the method for designing a layout of a semiconductor device according to the present invention.

A semiconductor device according to the present invention includes: a component layer, in which a plurality of components are formed; and a plurality of interconnection layers, which are stacked on the component layer and in which interconnection lines for electrically connecting the components to each other are formed. At least one of the interconnection layers includes a redundant interconnection line, which is formed in a region of the interconnection layer intersecting with an interconnection line formed in a layer overlying the interconnection layer, and which includes two conductor portions extending in such directions as intersecting with each other.

Another semiconductor device according to the present invention includes: a component layer, in which a plurality of components are formed; and a plurality of interconnection layers, which are stacked on the component layer and in which interconnection lines for electrically connecting the components to each other are formed. A plurality of redundant interconnection lines are arranged to form a regular pattern between interconnection lines formed in at least one of the interconnection layers.

According to the layout designing method of the present invention, when a circuit design should be modified to cope with a change in specifications, the layout of the circuit can be changed easily, thus shortening the time taken to develop a semiconductor device. For example, even when the circuit should be redesigned in accordance with a change in specifications after the layout has been once defined, a modified layout can be prepared quickly enough to cope with such a change. In addition, the layout can be modified in such a manner as to reflect the change in specifications only by changing a required minimum number of interconnection planar layouts. Accordingly, the time and cost to produce masks can be reduced. Furthermore, the interconnection planar layouts to be changed may be selected from only those located at highest possible levels, which correspond to masks used in later stages of a semiconductor device fabrication process. Thus, depending on how far the fabrication process has reached, half-finished products need not be thrown away and the time and cost required for the fabrication can be cut down.

A semiconductor device with redundant interconnection lines according to the present invention has such a structure as making the modification of layout easily implementable and optimizing the interconnection performance such as signal propagation delay.

The present invention provides (1) a layout designing method enabling a designer to develop a semiconductor device in a shorter time, (2) a storage medium having stored thereon a program for implementing the layout designing method, and (3) a semiconductor device that can be designed in a shorter time.

BRIEF DESCRIPTION OF THE DRAWINGS

FIG. 22A illustrates an interconnection planar layout (i.e., part of a first layout) that has not been changed yet;

FIG. 22B illustrates a "ripped-up" interconnection planar layout; and

FIG. 22C illustrates a "rerouted" interconnection planar layout (i.e., part of a second layout).

DESCRIPTION OF THE PREFERRED EMBODIMENTS

Figure 1:
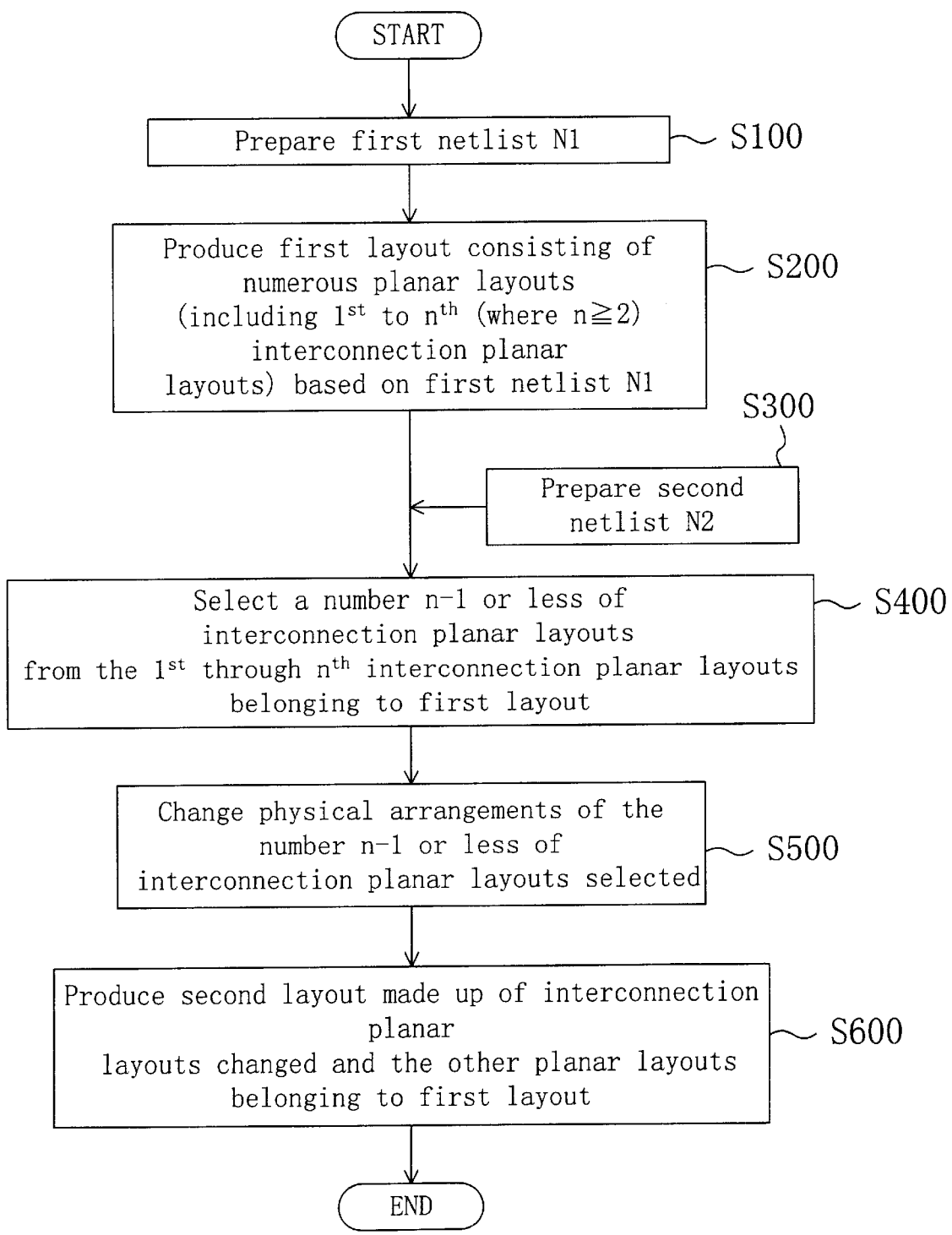
FIG. 1 is a flowchart illustrating an exemplary layout designing method according to the present invention.

FIG. 1 is a flowchart illustrating a layout designing method according to an exemplary embodiment of the present invention.

First, in Step S100, a first netlist N1 is prepared. The first netlist N1 may be made either according to the initial specifications of an LSI customized for a particular user or according to basic specifications of a general-purpose nature.

Next, in Step S200, a first layout is produced based on the first netlist N1. The first layout includes a component layout and an interconnection layout. The component layout includes a plurality of component planar layouts, and the interconnection layout also includes a plurality of interconnection planar layouts. In this embodiment, the interconnection layout is supposed to include first to $n^{th}$ (where $n \geq 2$) interconnection planar layouts to be sequentially stacked on the component layout. That is to say, the first interconnection layout forms the lowermost-level layer (i.e., just over the component layout), and the $n^{th}$ interconnection layout forms the uppermost-level layer. These processing steps S100 and S200 may be performed as in the conventional layout designing method. If necessary, the first layout may be prepared in advance and stored in a library.

Part of the component layout may be implemented to include components (or functional circuits) with the gate-array-type arrangement. However, the component layout is preferably made up of standard cells. By using standard cells, the performance and functionality of a resultant LSI can be enhanced. In addition, the LSI can be implemented at a higher density and at a lower cost. According to the inventive layout designing method, only by changing the interconnection layout of a multilevel interconnection structure, it is possible to cope with a much wider variety of specifications (or a much greater number of specification modifications). Thus, unlike a conventional gate-array-type arrangement, no master slice needs to be used anymore, because a component layout can be made up of standard cells only. Also, the layout designing method of the present invention is applicable not only to the conventional ASICs, but also to a system LSI including a plurality of macro-cells (also called "IPs"). A system LSI is made up of macro-cells, which are the counterparts of standard cells.

Subsequently, in Step S300, a second netlist N2 is prepared. The second netlist may be made according to either a change in specifications of an LSI customized for a particular user or determination of the specifications designated by a particular user, which changes the basic specifications (i.e., first layout).

In the succeeding processing steps from S400 on, a second layout, corresponding to the second netlist N2, is produced only by changing the interconnection layout.

First, in Step S400, a number n−1 or less of interconnection planar layouts are selected from the first through $n^{th}$ interconnection planar layouts belonging to the first layout.

Next, in Step S500, the respective physical arrangements (or patterns) of the number n−1 or less of interconnection planar layouts selected are changed.

Then, in Step S600, a second layout is made up of the interconnection planar layouts that have been changed and the other planar layouts belonging to the first layout (i.e., the component planar layouts and the other, non-selected interconnection planar layouts) based on the second netlist.

Specific methods for performing these Steps S400 through S600 will be described in greater detail later. Also, to implement a variety of layouts only by changing the interconnection layouts, redundant interconnection lines are preferably provided in advance for the interconnection layouts as will be described later referring to specific embodiments.

In the inventive layout designing method, the layout of an LSI can be re-designed according to the user's specifications only by changing the physical arrangements of the number n−1 or less of interconnection planar layouts, not by changing all the interconnection planar layouts as in the conventional method. Thus, the time and cost taken to produce masks can be cut down. Naturally, the number of interconnection planar layouts, which should have their layouts changed, is preferably as small as possible. This is because the smaller the number, the more effectively the time and cost taken to produce the masks can be reduced.

Also, the interconnection planar layouts to be changed are preferably located at as high levels as possible. If the planar layout to be changed corresponds to an upper-level mask, then fabrication process of an LSI does not have to be suspended but can be continuously performed until a process step requiring that mask is started. Thus, the fabrication time can be shortened. Also, possibly, half-finished products on the production line need not be thrown away in such a case. These effects can also be attained even when a pattern is written with an electron beam, for example, without using a mask.

Figure 2:
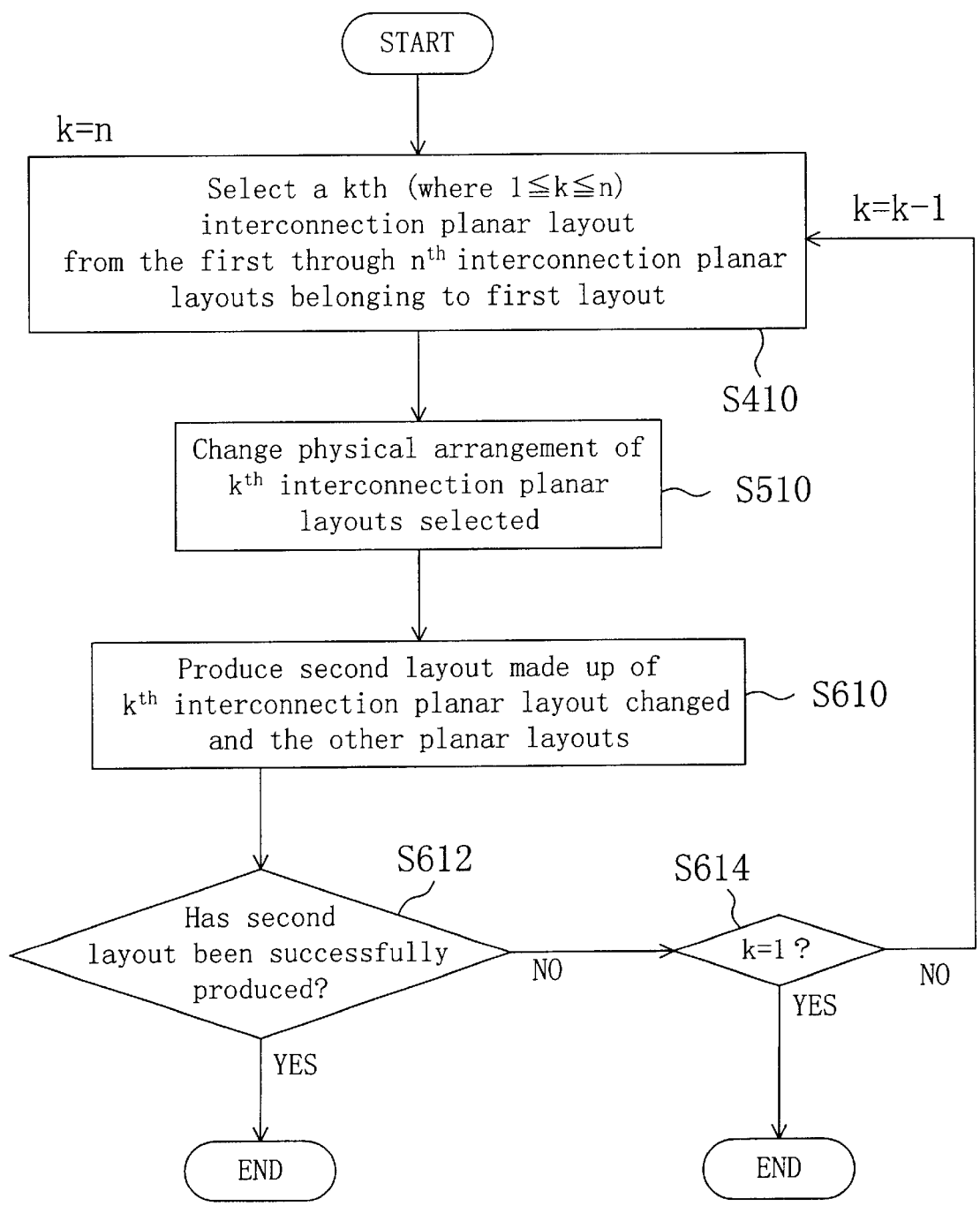
FIG. 2 is a flowchart illustrating another exemplary layout designing method according to the present invention.

The processing steps S400 through S600 shown in FIG. 1 may be performed in accordance with the flowchart shown in FIG. 2, for example.

First, in Step S410, one of the first through $n^{th}$ interconnection planar layouts belonging to the first layout, e.g., a $k^{th}$ interconnection planar layout, is selected. In this example, supposing k=n first, the uppermost-level interconnection planar layout is selected.

Next, in Step S510, the physical arrangement (i.e., pattern) of the $k^{th}$ interconnection planar layout selected is changed.

Then, in Step S610, a second layout is made up of the $k^{th}$ interconnection planar layout that has been changed and the other planar layouts belonging to the first layout based on the second netlist.

Subsequently, in Step S612, it is determined whether or not the second layout has been successfully produced. If the answer is YES, the layout designing process ends. That is to say, the second layout has been produced only by changing the layout of the uppermost-level, or $n^{th}$, interconnection planar layout belonging to the first layout.

If it is not determined in Step S612 that the second layout has been successfully produced and if it is not determined in Step S614 that k=1, then k is supposed to be equal to k−1 and a lower-level interconnection planar layout is selected and changed to produce the second layout (i.e., the steps S410, S510 and S610 are repeatedly performed). And when the second layout is successfully produced, the layout designing process ends. It should be noted that the processing steps S510 and S610 may be performed by a known "rip-up rerouting" technique.

The rip-up rerouting method will be described with reference to FIGS. 22A, 22B and 22C. FIG. 22A illustrates an interconnection planar layout (i.e., part of the first layout) that has not been changed yet. FIG. 22B illustrates a "ripped-up" interconnection planar layout. And FIG. 22C illustrates a "rerouted" interconnection planar layout.

As indicated by the phantom line in FIG. 22A, two RT1 terminals are interconnected before the layout is changed. Suppose the connection relationship (or logical relationship) has been changed according to the specifications changed such that one of the RT1 terminals (i.e., the upper one in FIG. 22A) should be used as a substitute RT2 terminal and be connected to the other RT2 terminal. In such a case, as shown in FIG. 22B, the route indicated by the phantom line in FIG. 22A is ripped up. Thereafter, as indicated by the phantom-line route in FIG. 22C, the two RT2 terminals are interconnected. It should be noted that these two terminals may be interconnected by a maze algorithm, for example. To illustrate the rip-up rerouting and interconnecting methods, the contents of Jiri Soukup, "Circuit Layout", Proceedings of the IEEE, Vol. 69, No. 10, pp. 1281–1304, October 1981 are hereby incorporated by reference.

That is to say, according to the processing flow shown in FIG. 2, the second layout can be produced only by changing a single, uppermost-level interconnection planar layout. If the second layout cannot be produced only by changing the single interconnection planar layout, then this flow should end. In such a case, the processing flow shown in FIG. 3 may be performed. Alternatively, the second layout may be produced by changing all the interconnection planar layouts.

Figure 3:
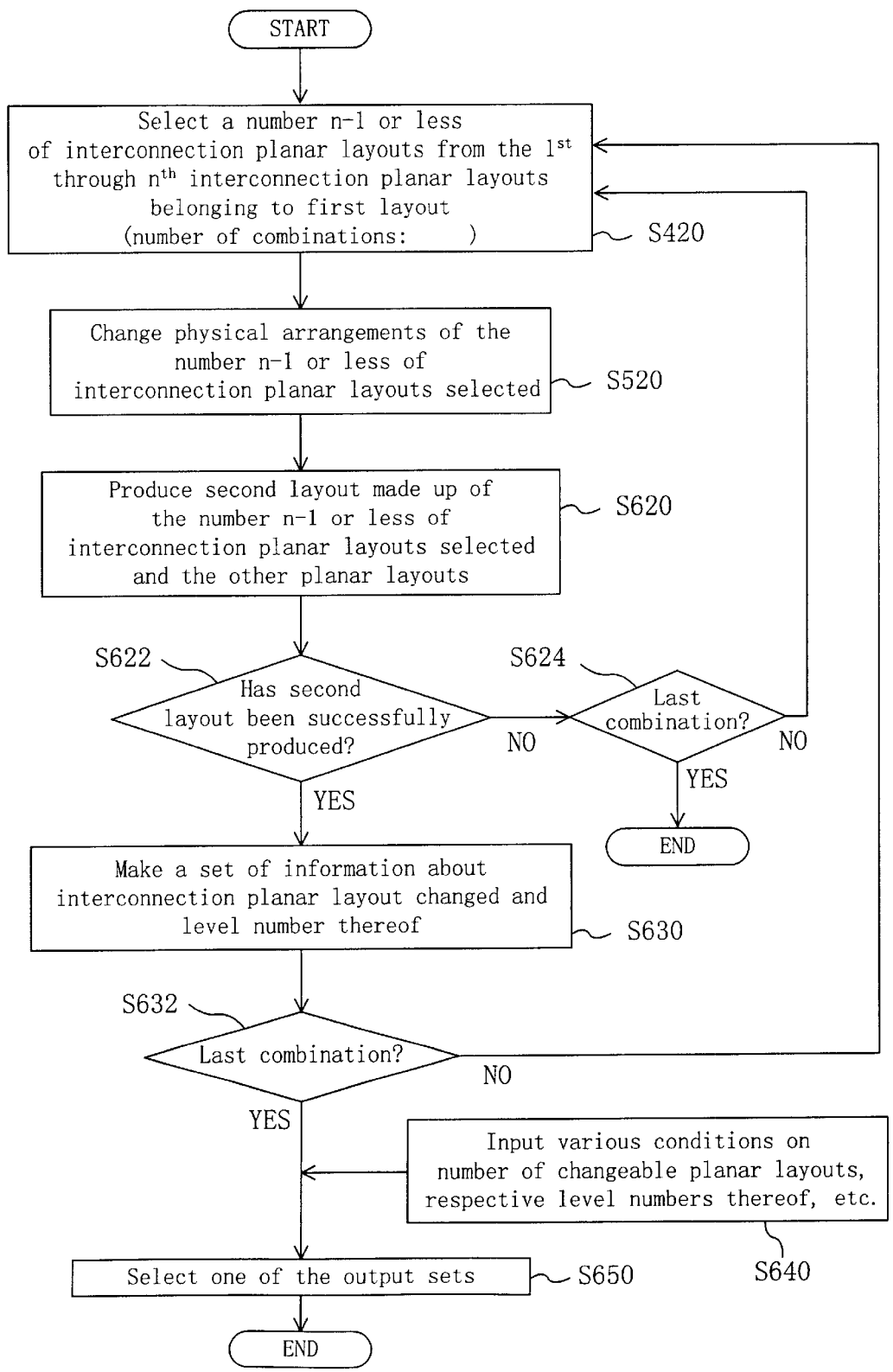
FIG. 3 is a flowchart illustrating still another exemplary layout designing method according to the present invention.

The processing steps S400, S500 and S600 shown in FIG. 1 may also be performed in accordance with the flowchart shown in FIG. 3.

According to the method shown in FIG. 3, all the possible first layouts are obtained by changing a number n−1 or less of interconnection planar layouts, which have been selected from a number n of interconnection planar layouts in an arbitrary combination.

First, in Step S420, a number n−1 or less (where n≧2) of interconnection planar layouts are selected in an arbitrary combination. The total number of combinations, each consisting of a number n−1 or less of layouts selected from a number n of layouts, is a sum of $_nC_m$ (where m is in the range from 1 to n−1). One combination is selected from all these possible combinations first. In practice, m, or the number of masks, is preferably as small as possible and the planar layouts are preferably selected one by one starting from a planar layout with the largest possible level number. That is to say, the interconnection layer, corresponding to the planar layout selected first, should preferably be located at as high a level as possible. When m=1, the processing flow of sequentially selecting the $n^{th}$ down to first interconnection planar layouts is implementable as in the flow shown in FIG. 2. A processing flow of selecting a plurality of interconnection planar layouts is also easily implementable.

The processing steps S520 and S620 may be performed by the rip-up rerouting method as in the processing steps S510 and S610 shown in FIG. 2. Then, in Step S622, it is determined whether or not the second layout has been successfully produced. If the answer to the inquiry in Step S622 is NO and if it is determined in Step S624 that this is not the last possible combination, the processing steps S420, S520 and S620 are repeatedly performed for the other possible combinations.

On the other hand, if the answer to the inquiry in Step S622 is YES, then at least one set of information about the interconnection planar layout changed and the level number thereof is made. If the layout designing method of the present invention is being executed in a computer, then the information is retained in storage at least temporarily. Thereafter, if it is not determined in Step S632 that this is the last possible combination, the processing steps S420, S520 and S620 are repeatedly performed for the other possible combinations.

At a point in time the processing steps S420 through S630 have been performed for all the possible combinations each consisting of a number n−1 or less of interconnection planar layouts, the set of information, consisting of the interconnection planar layout changed and the level number thereof, has already been made for every possible combination defining the second layout. In other words, it is possible to obtain a set of all the possible solutions for producing the second layout under the condition that less than a number n of masks are changed.

Then, various conditions on the number of changeable planar layouts, the respective level numbers thereof and so on are input in Step S640. Finally, in accordance with these conditions, the most preferable solution is selected from all these possible solutions to end the layout designing processing flow. For example, the input conditions may require that the number of masks should be as small as possible and/or that the mask to be modified should be located at as high a level as possible. In accordance with these conditions, an optimum mask (or interconnection planar layout) is selected. For instance, supposing a set of masks have already been actually produced based on the first layout, the number of masks is more important than the location (or the level) of the mask to be modified. On the other hand, if the fabrication of an LSI has actually been started on a production line, then the locations of modifiable masks should be input so that only the masks used for fabrication process steps yet to be performed are changed.

As can be understood, the present invention can cope with any change in specifications only by changing a number (which is smaller than n at least by one) of interconnection planar layouts, not by changing all the interconnection planar layouts as is done in the conventional method. Accordingly, the present invention can cut down the cost and time to produce masks.

In the processing steps S612 and S622 shown in FIGS. 2 and 3, respectively, it is determined just whether or not the second layout has been successfully produced. Alternatively, this determination may be carried out after the performance of interconnection (e.g., signal propagation delay time) has been evaluated.

Embodiment 1

Hereinafter, a method for designing a mask according to a first exemplary embodiment of the present invention will be described with reference to FIGS. 4 through 7C. In this embodiment, the layout designing method of the present invention is applied to the modification of a mask.

An object of this embodiment is to change an initial layout, corresponding to an initial netlist N1, into a modified layout corresponding to a netlist N2, which has been defined to cope with a change in circuit design, only by modifying an upper-level interconnection layer based on the initial layout and the changed netlist N2. In the following description, an interconnection layer will also be called a "metal layer".

Figure 4:
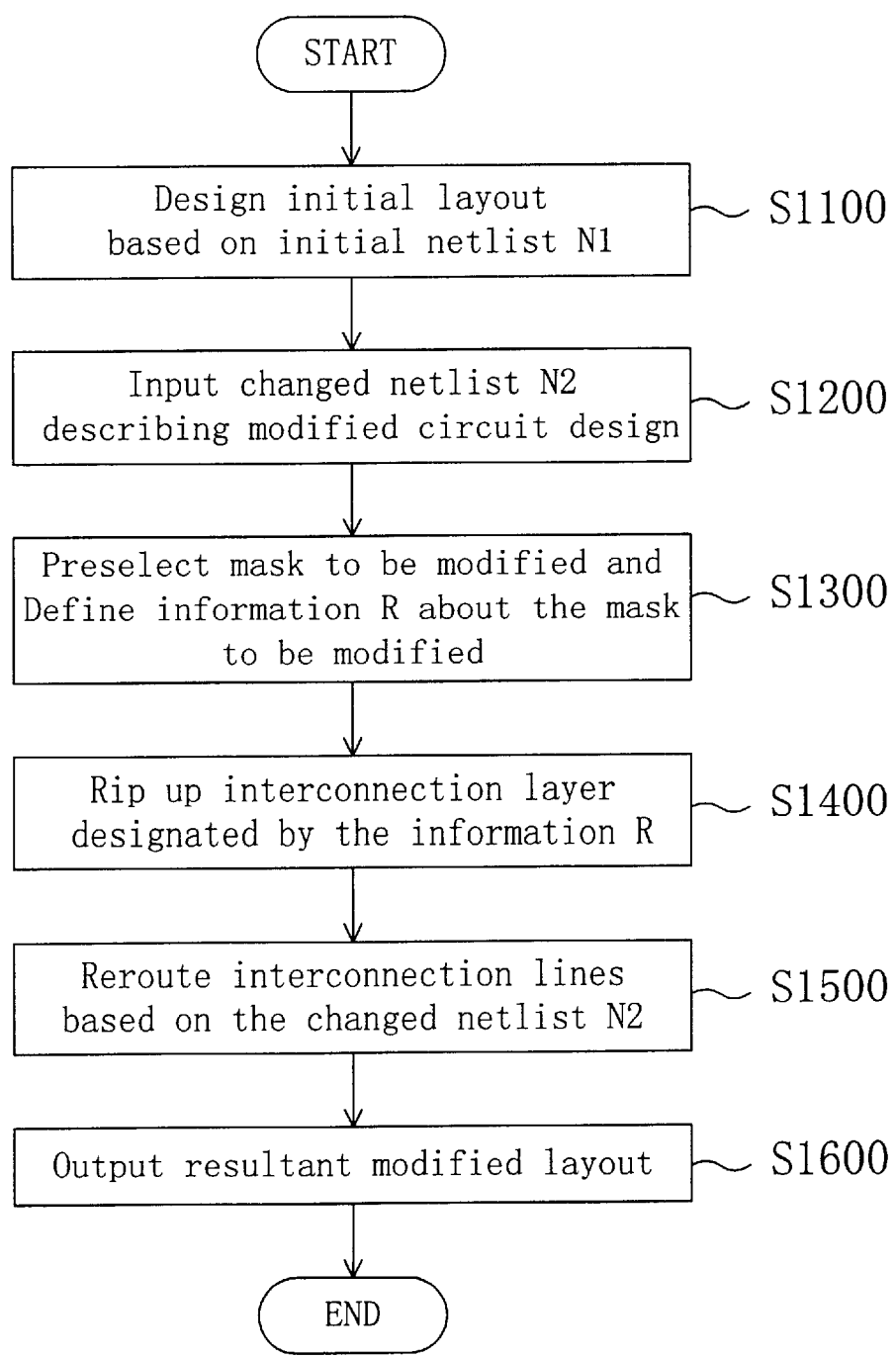
FIG. 4 is a flowchart illustrating a mask designing method according to a first embodiment of the present invention.

FIG. 4 is a flowchart illustrating a mask designing method according to the first embodiment.

First, in Step S1100, an initial layout is designed based on the initial netlist N1.

Next, in Step S1200, a changed netlist N2, describing a modified circuit design to reflect a change in specifications, is input. By performing these processing steps S110 and S1200, the initial layout, which has been designed based on the initial netlist N1, and the changed netlist N2, which is interconnection information used as a basis of layout change, are obtained.

Then, in Step S1300, a mask to be modified is preselected. Specifically, in this processing step, an interconnection layer, which is required for changing the initial layout corresponding to the initial netlist N1 into the modified layout corresponding to the changed netlist N2, is sequentially searched for starting from the uppermost-level interconnection layer according to the initial layout. Once such an interconnection layer is located, a mask, which should be modified to change the interconnection layer, is preselected. Then, information R about the mask to be modified is defined.

Subsequently, in Step S1400, the interconnection layer to be modified is ripped up based on the information R defined.

Thereafter, in Step S1500, the interconnection lines in the interconnection layers ripped up are rerouted according to the changed netlist N2.

And then, in Step S1600, the resultant modified layout obtained by performing the steps S1100 through S1500 is output.

The mask designing method according to this embodiment is characterized by including the steps of: sequentially searching for an interconnection layer to be modified among all the interconnection layers starting from the uppermost-level interconnection layer; preselecting a mask to be modified for the interconnection layer located; defining the information R about the mask to be modified; rerouting the interconnection lines in the interconnection layer in question; and outputting a resultant modified layout. According to this method, only a required minimum number of masks should be re-designed and modified masks thereof should be produced.

As described above, according to this embodiment, even if the design of a circuit has been changed, re-designing and mask production need not be performed for all the interconnection layers. Instead, only a required minimum number of masks, which have been located by a sequential search from the uppermost-level interconnection layer, should be re-designed and produced again based on the information R about the mask to be modified that has been defined through estimation. Accordingly, not only the cost but also the time taken to re-design and reproduce masks can be cut down, thus shortening the development time of an LSI.

Also, the modification of the uppermost-level interconnection layer, which is formed in a process step near the end of a fabrication process, is prioritized. Accordingly, even if it turns out that a circuit should be redesigned at a point in time the fabrication process of an LSI has already advanced to a certain extent, the circuit still can be modified easily. In other words, a turn around time (TAT) required for modifying an LSI can be shortened.

Furthermore, the mask designing method according to this embodiment is implementable as various methods other than the method for designing an LSI by combining basic circuits each including a plurality of transistors. Thus, according to this method, the circuit area can be optimized and the area of LSI can be reduced. As a result, the costs for fabricating an LSI can be reduced.

Next, it will be specifically described with reference to FIG. 4 and FIGS. 5A through 5C how the layout is redesigned in accordance with the processing flow shown in FIG. 4.

Figure 5A:
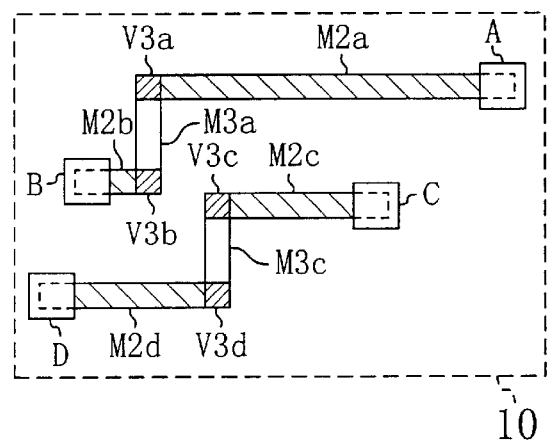
FIGS. 5A, 5B and 5C illustrate a pattern to be modified, a pattern being modified and a modified pattern, respectively, for a layout to be redesigned according to the first embodiment.
Figure 5B:
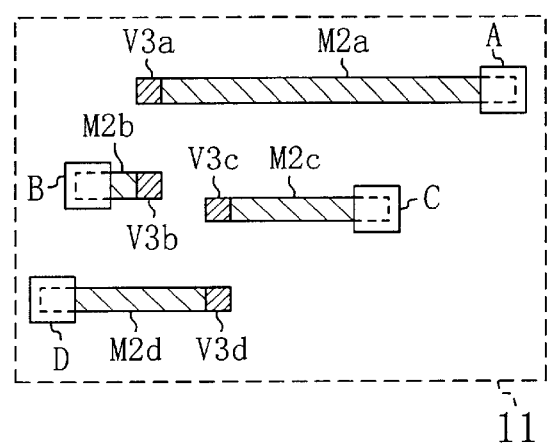
Figure 5C:
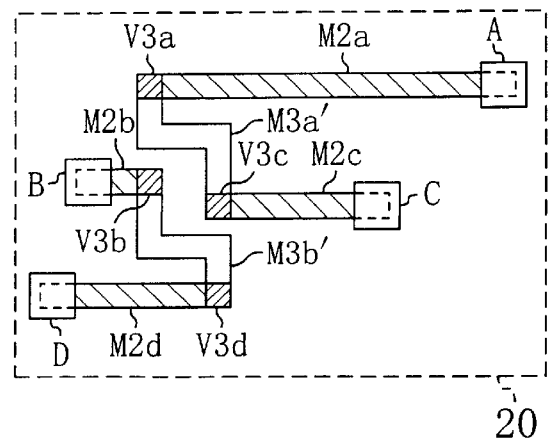

FIGS. 5A, 5B and 5C illustrate a pattern to be modified, a pattern being modified and a modified pattern, respectively, for a layout to be redesigned. In this exemplary embodiment, it will be described how the layout is redesigned for three metal layers M3, M2 and M1 among five interconnection layers. In these metal layers, the layer M3 is the uppermost layer, the layer M2 is the intermediate layer and the layer M1 is the lowermost layer. Also, the interconnection layers further include two interlevel connection layers between the adjacent layers M3 and M2 and M2 and M1. In FIGS. 5A, 5B and 5C, interconnection lines M2a, M2b, M2c and M2d belong to the metal layer M2, and interconnection lines M3a, M3a', M3b' and M3c belong to the metal layer M3. And via holes V3a, V3b, V3c and V3d belong to an interlevel connection layer V3 for interconnecting the interconnection lines in the metal layers M2 and M3.

First, in Step S1100 shown in FIG. 4, an initial layout is designed based on an initial netlist N1. In the illustrated embodiment, the initial netlist N1 describes the connection relationship among terminals A through D as:

net 1 connect (A, B)

net 2 connect (C, D)

That is to say, the initial netlist N1 indicates that the terminals A and B should be connected together and that the terminals C and D should be connected together. By performing initial routing based on the initial netlist N1, the initial layout 10 shown in FIG. 5A is obtained. Specifically, as shown in FIG. 5A, the terminal A is connected to the terminal B through the interconnection line M2a, via hole V3a, interconnection line M3a, via hole V3b and interconnection line M2b. Similarly, the terminal C is connected to the terminal D through the interconnection line M2c, via hole V3c, interconnection line M3c, via hole V3d and interconnection line M2d.

Next, in Step S1200, a changed netlist N2 is obtained. In the illustrated embodiment, the changed netlist N2 describes the connection relationship among terminals A through D as:

net 1 connect (A, C)

net 2 connect (B, D)

That is to say, the changed netlist N2 indicates that the terminals A and C should be connected together and that the terminals B and D should be connected together.

Then, in Step S1300, a mask to be modified is preselected based on the changed netlist N2 and information R about the mask to be modified is defined. In the illustrated embodiment, the metal layer M3 is designated as an interconnection layer with the mask to be modified based on the information R.

Subsequently, in Step S1400, the mask to be modified is ripped up based on the information R. That is to say, the metal layer M3 is ripped up based on the information R and data about the other interconnection layers is obtained. In this processing step, the interlevel connection layer V3 is not ripped up, because the layer V3 is not designated by the information R. In the illustrated embodiment, the interconnection lines M3a and M3c belonging to the metal layer M3 are removed from the initial layout 10, thereby obtaining a layout 11 shown in FIG. 5B.

Thereafter, in Step S1500, the interconnection lines are rerouted according to the changed netlist N2 and based on the interconnection layer data, thereby obtaining a modified layout 20 shown in FIG. 5C. Specifically, the terminal A is connected to the terminal C through the interconnection line M2a, via hole V3a, interconnection line M3a', via hole V3c and interconnection line M2c. Similarly, the terminal B is connected to the terminal D through the interconnection line M2b, via hole V3b, interconnection line M3b', via hole V3d and interconnection line M2d.

In the conventional designing method using a gate-array-type and/or embedded-gate-array-type arrangement, if the circuit design has been changed in the above exemplified manner, respective masks corresponding to the three metal layers M1 through M3 and the two interlevel connection layers, i.e., five masks in total, should be redesigned and reproduced. In contrast, according to the method of this embodiment, only one mask, corresponding to the metal layer M3, should be redesigned and reproduced. Thus, it can be understood that the time and cost taken to modify the mask can be considerably reduced according to the present invention.

Figure 6:
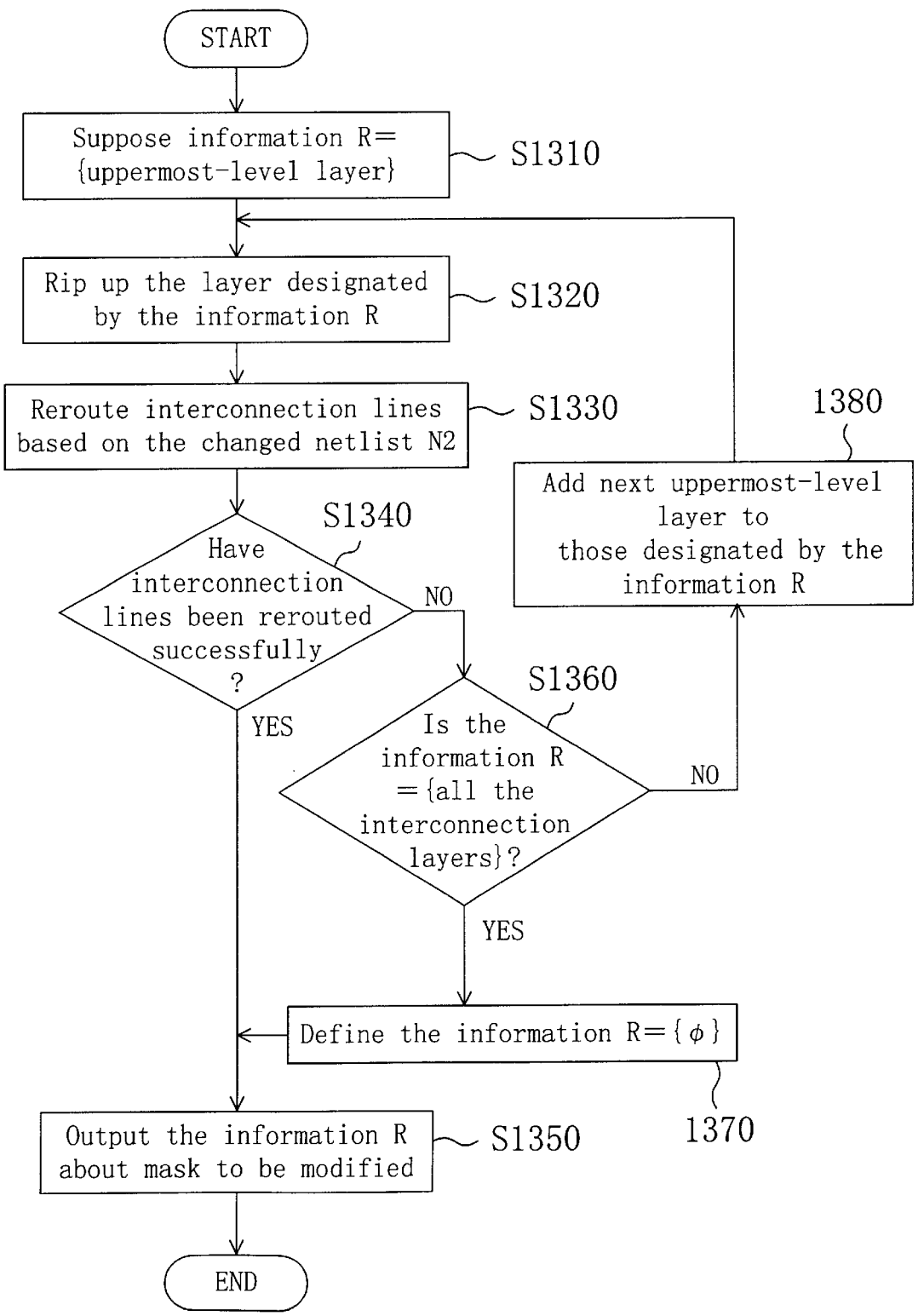
FIG. 6 is a flowchart illustrating the detailed processing flow of the step S1300 of preselecting a mask to be modified as shown in FIG. 4.

Hereinafter, the processing step of preselecting a mask to be modified and defining information R about the mask, i.e., the processing step S1300 shown in FIG. 4, will be described in greater detail with reference to FIGS. 5A through 7C. FIG. 6 is a flowchart illustrating the detailed processing flow of the step S1300 shown in FIG. 4.

First, in Step S1310, the uppermost one of the interconnection layers, e.g., the metal layer M3, is supposed to be a layer designated by the information R, i.e., supposing R={M3}.

Next, in Step S1320 as in the step S1400 shown in FIG. 4, the interconnection lines, belonging to the metal layer M3 designated by the information R, are virtually ripped up from the initial layout 10 shown in FIG. 5A, thereby defining data about the interconnection layers, i.e., the other metal layers M2 and M1 and the interlevel connection layer V3. As a result, the layout 11 shown in FIG. 5B is obtained.

Then, in Step S1330 as in the step S1400 shown in FIG. 4, the interconnection lines are virtually rerouted according to the changed netlist N2 and based on the data about the interconnection layers. If the interconnection lines have been successfully rerouted as a result, then the modified layout 20 shown in FIG. 5C is obtained.

Thereafter, in Step S1340, it is determined whether or not the interconnection lines have been virtually rerouted successfully. If the answer is YES, i.e., if the interconnection line rerouting processing is completed, then the processing advances to the next step S1350, outputting the information R (i.e., R={M3}) about the mask to be modified, which was defined in Step S1310, as it is. In such a case, the processing step of preselecting the mask to be modified and defining the information R about the mask, i.e., Step S1300 shown in FIG. 4, ends. On the other hand, if the interconnection lines have not been virtually rerouted successfully, then the processing advances to Step S1360.

In Step S1360, it is determined whether or not the information R about the mask to be modified designates all the interconnection layers. If the information R designates all the interconnection layers, then it is now clear that the circuit couldn't be redesigned even by modifying all the interconnection layers. Thus, modification of transistor placement is also needed. In such a situation, the processing advances to Step S1370 to define the information R about the mask to be modified as: R={φ}. Thereafter, in Step S1350, the information R (={φ}) is output to end the processing step S1300 shown in FIG. 4. Alternatively, if the information R does not designate all the interconnection layers, then the processing advances to Step S1380.

In Step S1380, the uppermost one of the other interconnection layers, which are lower than, and are not included in, the layers designated by the information R, is added to those designated by the information R to return to the Step S1320. Then, the same processing is repeatedly performed from Step S1320 of virtually ripping up the interconnection layers added.

Next, it will be specifically described with reference to FIGS. 7A through 7C how the layout is redesigned in accordance with the processing flow shown in FIG. 6.

Figure 7A:
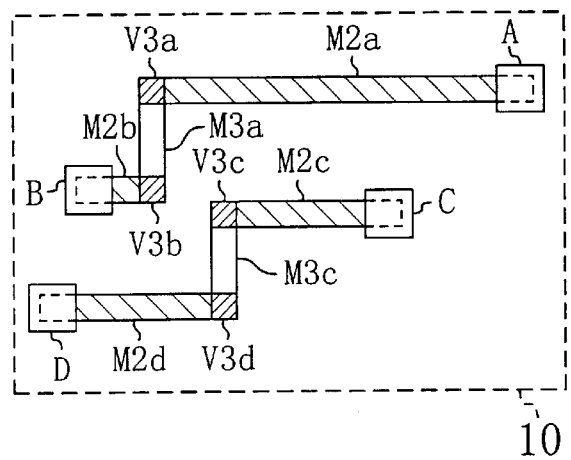
FIGS. 7A, 7B and 7C illustrate a pattern to be modified, a pattern being modified and a modified pattern, respectively, for a layout to be redesigned in preselecting the mask to be modified.
Figure 7B:
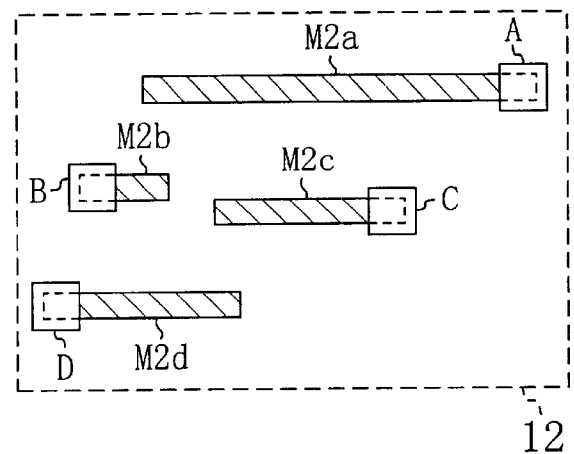
Figure 7C:
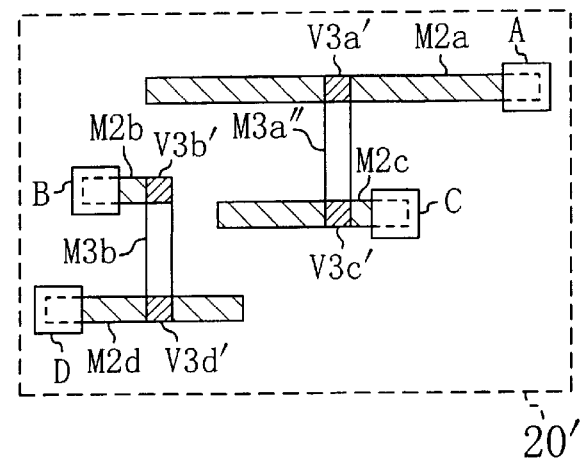

FIGS. 7A, 7B and 7C illustrate a pattern to be modified, a pattern being modified and a modified pattern, respectively, for a layout to be redesigned. FIG. 7A illustrates the same initial layout 10 as that shown in FIG. 5A.

First, in. Step S1320 shown in FIG. 6, the metal layer M3 is virtually ripped up from the initial layout 10 shown in FIG. 7A, thereby obtaining the same layout 11 as that shown in FIG. 5B.

Suppose the rerouting in Step S1330 has failed. In such a case, it is determined in Step S1340 that the rerouting has failed, and the processing advances to Step S1360. The answer to the inquiry in Step S1360 is NO, because the information R indicates R={M3}, not designating all the interconnection layers. Thus, the processing advances to Step S1380.

The uppermost one of the other interconnection layers, which are lower than the metal layer M3 designated by the information R, is the interlevel connection layer V3. Accordingly, R is modified as {M3, V3} in Step S1380 and then the processing returns to Step S1320.

In Step S1320, the interconnection layer added to the information R, i.e., the interlevel connection layer V3, is virtually ripped up, thereby defining the interconnection layer data and obtaining the layout 12 shown in FIG. 7B.

Next, in Step S1330, the terminal A is virtually connected to the terminal C using the interconnection line M3a" and via holes V3a' and V3c' belonging to the interlevel connection layer V3, and the terminal B is virtually connected to the terminal D using the interconnection line M3b and via holes V3b' and V3d' belonging to the interlevel connection layer V3. As a result, the modified layout 20' shown in FIG. 7C is obtained.

As described above, by performing the step of preselecting a mask to be modified in the designing method of this embodiment, the information R about the mask to be modified, which is required for designing a layout according to the changed netlist N2, can be defined through virtual rip-up and rerouting (i.e., Steps S1320 and S1330 shown in FIG. 6).

In the foregoing embodiment, the new information R is defined based on whether or not rerouting according to the changed netlist N2 has succeeded as in Step S1340 shown in FIG. 6. Optionally, the information R may be defined considering the interconnection performance as well. In such a case, appropriate via holes can be selected from the interlevel connection layer V3 while taking the interconnection performance into account. Thus, a modified layout with excellent interconnection performance can be obtained. In the example shown in FIGS. 7A through 7C, an excellent modified layout with a smaller wire length, i.e., with a reduced interconnection resistance, can be obtained by defining the information R while evaluating the wire length as one of the parameters representing the interconnection performance.

Embodiment 2

Next, mask designing method and semiconductor device according to a second exemplary embodiment of the present invention will be described with reference to FIGS. 8 through 10D. An object of this embodiment is to facilitate redesigning and to prevent the interconnection performance from being deteriorated due to the redesigning by preparing an easily modifiable layout for a semiconductor device, no matter whether the design of a circuit should be changed or not.

Figure 8:
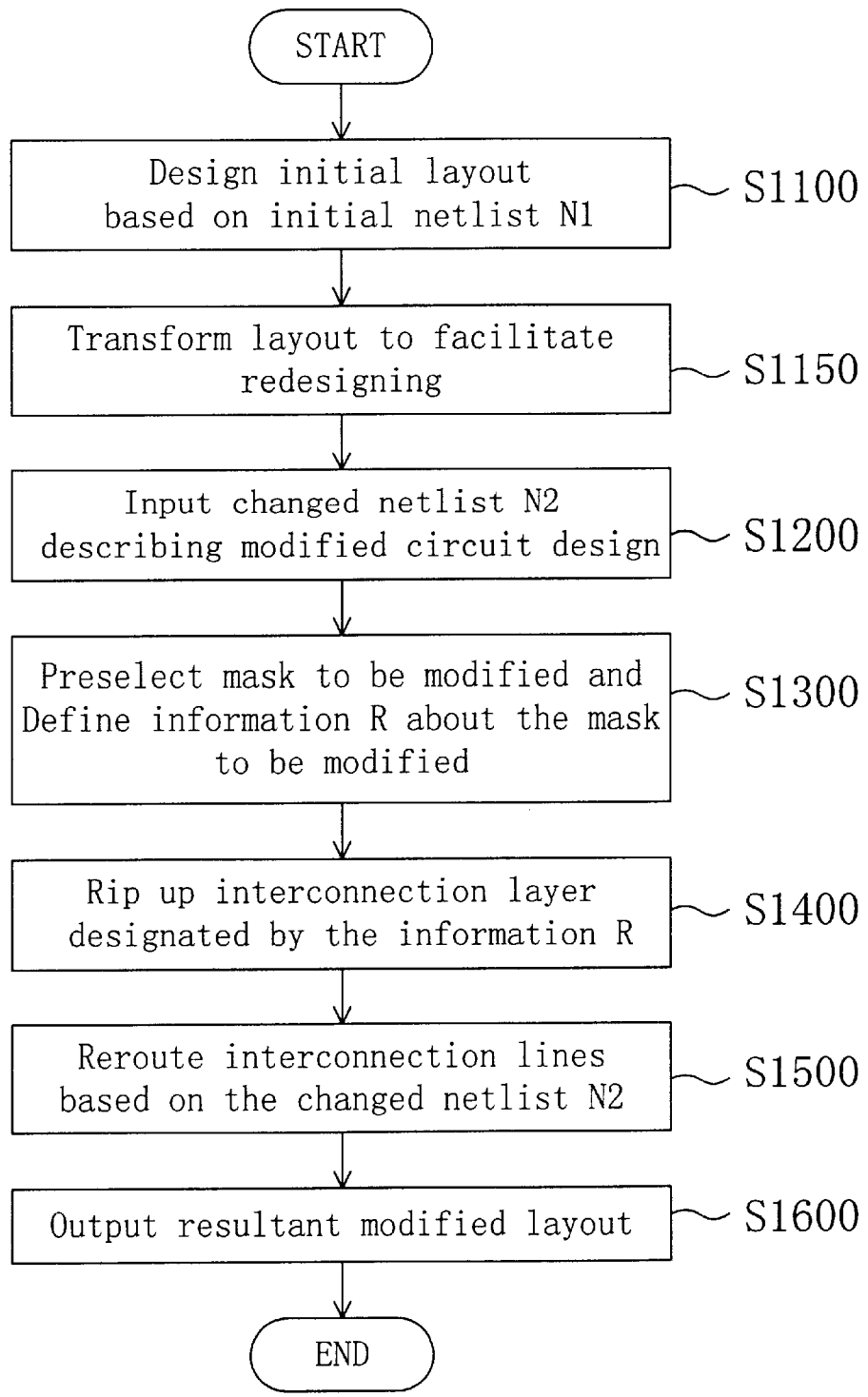
FIG. 8 is a flowchart illustrating a mask designing method according to a second embodiment of the present invention.

FIG. 8 is a flowchart illustrating a mask designing method according to this embodiment. The mask designing method shown in FIG. 8 further includes Step S1150 posterior to Step S1100 of designing an initial layout, in addition to all the processing steps of the mask designing method shown in FIG. 4. In Step S1150, a layout is transformed to facilitate redesigning, i.e., to make the layout easily modifiable.

Figure 9A:
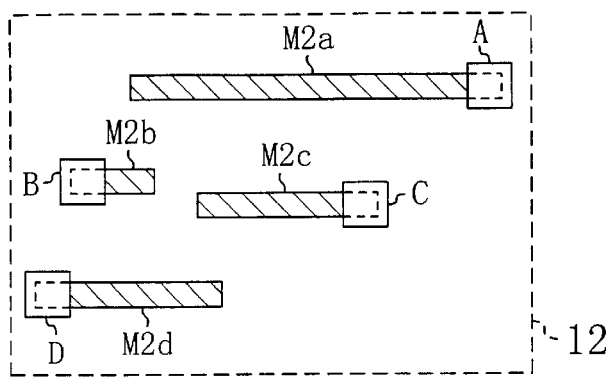
FIGS. 9A, 9B, 9C and 9D illustrate a pattern before design modification, a pattern after the design modification, a pattern after the design modification and designing, and a pattern after the design modification and redesigning, respectively, for a layout to be redesigned according to the second embodiment.

Hereinafter, Step S1150 of facilitating redesigning as shown in FIG. 8 will be exemplified with reference to FIGS. 9A, 9B, 9C and 9D. FIGS. 9A, 9B, 9C and 9D illustrate a pattern before design modification, a pattern after the design modification, a pattern after the design modification and designing, and a pattern after the design modification and redesigning, respectively, for a layout to be redesigned. FIG. 9A illustrates the same layout 12 as that shown in FIG. 7B according to the first embodiment. Only the metal layer M2 exists in this layout 12, which is obtained by removing the metal layer M3 and the interlevel connection layer V3 from the initial layout 10 shown in FIG. 7A according to the first embodiment.

Figure 9B:
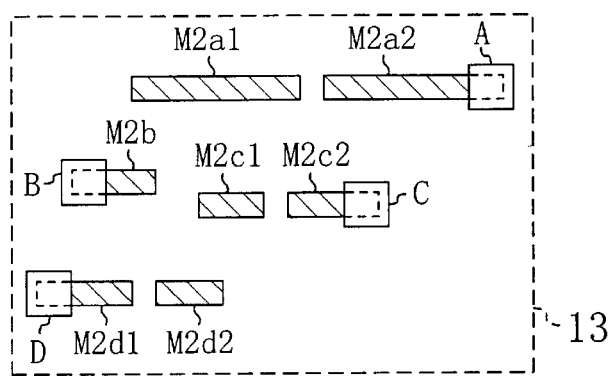

In Step S1150 shown in FIG. 8, the interconnection line M2a, which is a single line in the layout 12 shown in FIG. 9A, is divided into two interconnection lines M2a1 and M2a2 as shown in FIG. 9B. Similarly, the interconnection lines M2c and M2d are also divided into interconnection lines M2c1 and M2c2 and interconnection lines M2d1 and M2d2, respectively. The other interconnection line M2b is a short line judging from a predetermined standard, and therefore is not divided here. As a result, an easily modifiable layout 13 shown in FIG. 9B is obtained.

Figure 9C:
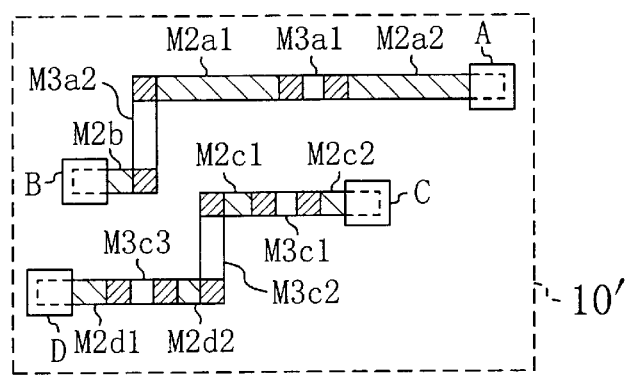

Suppose the layout 13 is designed according to the initial netlist N1 as is done in the first embodiment. In such a case, a layout 10' shown in FIG. 9C is obtained. Specifically, the terminal A is connected to the terminal B using the interconnection lines M2a2, M3a1, M2a1, M3a2 and M2b and respective via holes belonging to the interlevel connection layer V3. And the terminal C is connected to the terminal D using the interconnection lines M2c2, M3c1, M2c1, M3c2, M2d2, M3c 3 and M2d1 and respective via holes belonging to the interlevel connection layer V3. As a result, the layout 10', satisfying the connection relationship defined by the initial netlist N1 as is done by the initial layout 10 shown in FIG. 7A, is obtained.

Figure 9D:
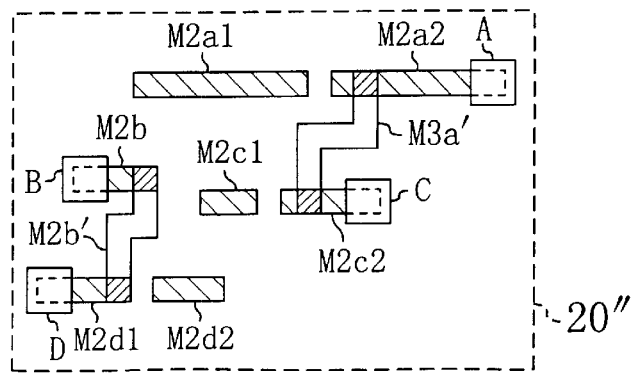

Furthermore, if the circuit design has been changed as in the first embodiment, then the layout is redesigned according to the changed netlist N2, for example, thereby obtaining a modified layout 20" shown in FIG. 9D. In this case, the terminal A is connected to the terminal C using the interconnection lines M2a2, M3a' and M2c2 and respective via holes belonging to the interlevel connection layer V3. And the terminal B is connected to the terminal D using the interconnection lines M2b, M2b' and M2d1 and respective via holes belonging to the interlevel connection layer V3. As can be seen if the modified layout 20" shown in FIG. 9D is compared to the modified layouts 20 and 20' shown in FIGS. 5C and 7C according to the first embodiment, the interconnection between the terminals A and C or between the terminals B and D is realized by the modified layout 20" using a route shorter than that of the layout 20 or 20'.

The mask designing method of this embodiment is characterized by intentionally dividing an interconnection line, which could be drawn as a line, in advance. In this manner, the layout can be modified easily to cope with a change in circuit design. In addition, since the wire length can be optimized, or can be made as short as possible, the interconnection resistance and capacitance can be reduced. Accordingly, it is possible to minimize the signal propagation delay through the interconnection lines by improving the performance thereof.

Figure 10A:
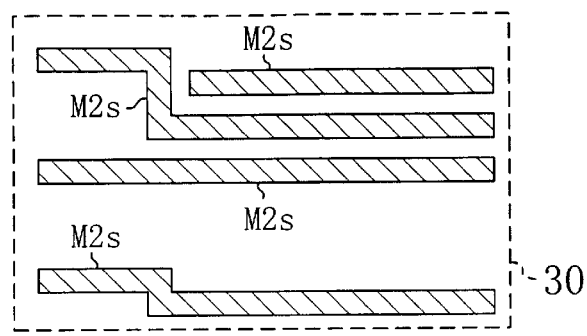
FIG. 10A illustrates an initial layout for a metal layer in a modified example of the designing method according to the second embodiment.
Figure 10B:
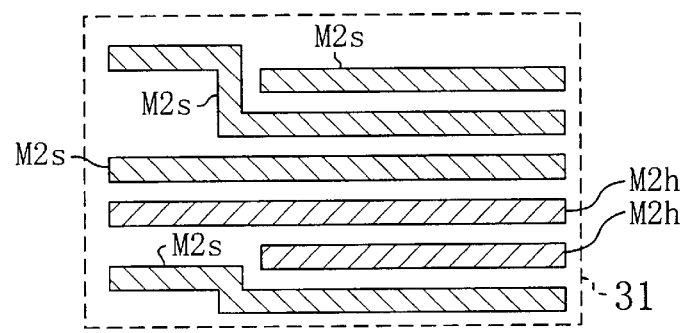
FIG. 10B illustrates a layout obtained by performing a type of design modification processing in the modified example.

FIGS. 10A through 10D and FIGS. 11A and 11B illustrate a pattern for an initial layout of the metal layer M2, patterns obtained by performing various types of design modification on the initial layout, and redesigned patterns according to a modified example of the second embodiment. FIG. 10A illustrates an initial layout 30 consisting of the metal layer M2 only. In the design modification processing of this modified example, interconnection lines not used in the initial layout 30, i.e., redundant interconnection lines M2h, are additionally provided in a free space between the interconnection lines M2s, thereby obtaining an easily modifiable layout 31 as shown in FIG. 10B.

In this modified example, the number of interconnection patterns, which can be used in the metal layer M2 in modifying the interconnection after the metal layer M3 and interlevel connection layer V3 have been ripped up, can be increased by using the easily modifiable layout 31 including the additional redundant interconnection lines M2h. Thus, by increasing the number of interconnection patterns in the metal layer M2 using the redundant interconnection lines M2h, the wire length can be optimized and rerouting can be performed more easily.

Figure 10C:
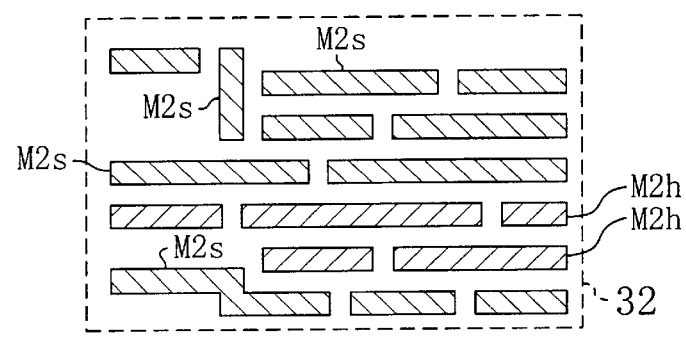
FIG. 10C illustrates a layout obtained by performing another type of design modification processing in the modified example.
Figure 10D:
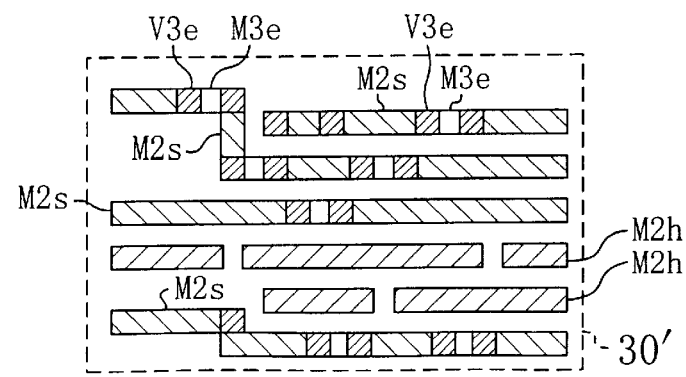
FIG. 10D illustrates a layout designed using the pattern shown in FIG. 10C in the modified example.

This modified example may be combined with any another designing technique. For example, FIG. 10C illustrates an easily modifiable layout 32, which is obtained by applying the technique of dividing an interconnection line in advance as described in this embodiment to the layout shown in FIG. 10B. In this method, by dividing the interconnection lines M2s and redundant interconnection lines M2h in advance, an even larger number of interconnection patterns can be used in the metal layer M2 for modifying the interconnection after the metal layer M3 and interlevel connection layer V3 have been ripped up. That is to say, as shown in FIG. 10D, the interconnection is realized using the interconnection lines M2s, via holes belonging to the interlevel connection layer V3 and short interconnection lines M3e belonging to the metal layer M3. As a result, the wire length can be optimized and rerouting can be performed even more easily. In addition, a layout 30', which is electrically equivalent to the initial layout 30, can be obtained.

Figure 11A:
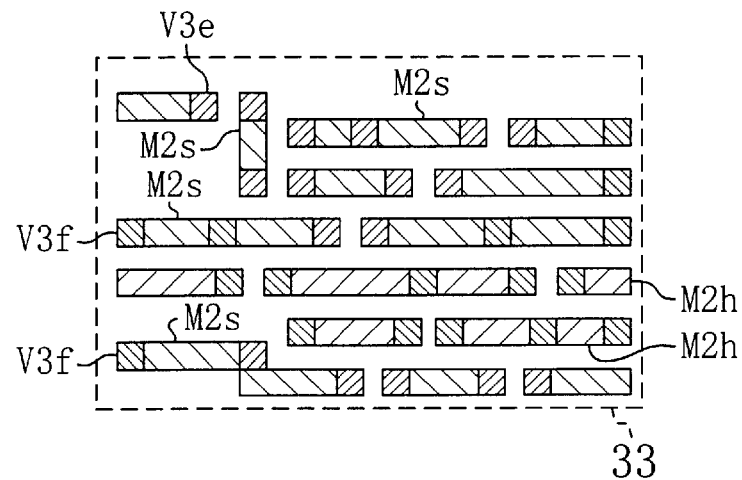
FIG. 11A illustrates a layout obtained by performing design modification processing on a metal layer and an interlevel connection layer in another modified example of the designing method according to the second embodiment.
Figure 11B:
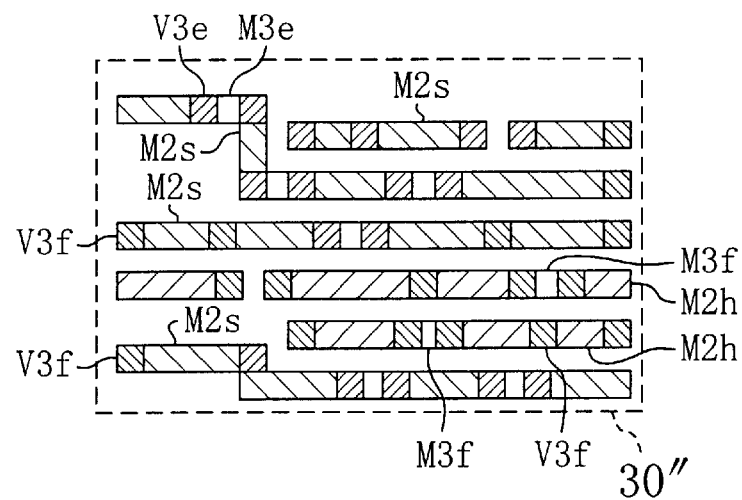
FIG. 11B illustrates a layout designed using the pattern shown in FIG. 11A.

Also, as shown in FIG. 11A, an easily modifiable layout 33 may be obtained by adding a plurality of redundant via holes V3f to the layout 30' shown in FIG. 10D, and rerouting may be performed using this layout 33. As a result, a layout 30" shown in FIG. 11B is obtained. In such a case, a layout, which is electrically equivalent to the initial layout 30 shown in FIG. 10A, can be obtained by using the interconnection lines M2s and M3e and via hole V3e. Moreover, additional interconnection lines can also be provided using the redundant interconnection lines M2h, redundant via holes V3f and interconnection lines M3f. That is to say, if the redundant via holes V3f are used, interconnection lines belonging to the upper-level metal layer M3 can be used even more effectively. Accordingly, rerouting can be performed even more easily and the wire length can be optimized while using the metal layers M2 and M3 more effectively. In this case, the redundant via holes are preferably arranged in a checkerboard pattern so as to use other metal layers even more effectively.

It should be noted that the respective layouts, on which the design modification processing has already been performed according to this embodiment, i.e., the easily modifiable layouts 13, 31, 32 and 33 shown in FIGS. 9B, 10B, 10C and 11A, respectively, may be formed within a semiconductor device in advance. In such a case, it is possible to provide a semiconductor device that can easily cope with a change in circuit design while optimizing its wire length and improving its interconnection performance.

In the foregoing embodiments, the present invention has been described as being applied to a multilevel interconnection structure including three metal layers. However, it is clear that similar effects can also be attained by applying the present invention to a multilevel interconnection structure including two metal layers or four or more metal layers.

Also, the present invention is equally effective even if the region to be redesigned is only a part of a layout or if the divided metal interconnection lines and redundant interconnection lines or via holes that are employed in the design modification processing are used for just a part of a layout.

The present invention is also applicable to a system LSI. A system LSI, as well as an ASIC, is often customized for a particular user. Accordingly, a currently available system LSI also has similar problems to those described for an ASIC. That is to say, by applying the present invention to a system LSI, the time and cost to develop a system LSI can be reduced, too.

Figure 12:
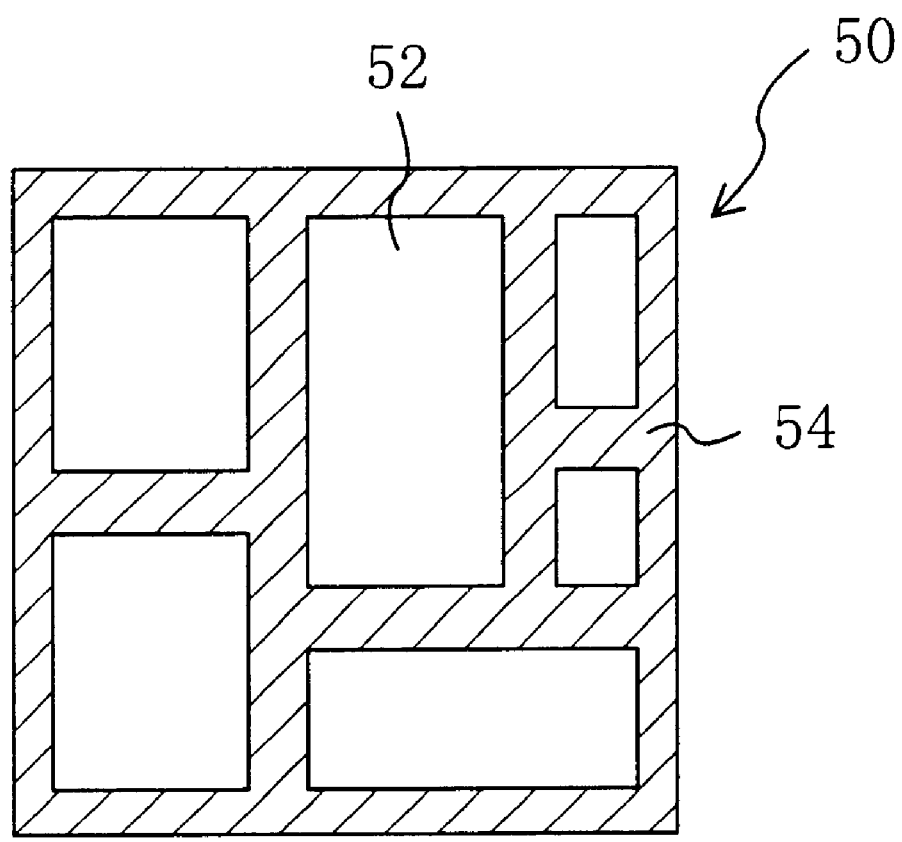
FIG. 12 schematically illustrates a plan view of a system LSI.

FIG. 12 schematically illustrates a plan view of a system LSI 50. The system LSI 50 includes a plurality of macroblocks 52 (also called "IP's" or "cores") and an interconnection 54 between the macroblocks. The macroblocks 52 may include CPU, DSP, RAM, ROM, clock/timing circuits, I/O circuit and so on. Most of the layouts for the macroblocks may be those stored in a cell library. Accordingly, in designing the layout of a system LSI for a particular user, once required macroblocks have been selected from a cell library, only the layouts of the interconnection between the macroblocks need to be designed. The layout designing method of the present invention is applicable to the design of the interconnection between macroblocks.

That is to say, when the interconnection between the macroblocks is implemented as a multilevel interconnection structure, the layout of a desired system LSI can be designed only by changing a smallest possible number of interconnection planar layouts located at highest possible levels. To increase the flexibility in designing, a long interconnection line is preferably divided and/or redundant interconnection lines (including redundant via holes) are preferably provided as described in the second embodiment. Also, a structure, in which the input/output terminals of a redundant transistor can be interconnected in the uppermost-level interconnection layer or a switch box for an upper interconnection layer is provided in a channel region, is preferably formed.

Hereinafter, exemplary interconnection layouts including redundant interconnection lines, which are suitably applicable to the semiconductor device of the present invention (including ASICs and system LSIs), will be described with reference to FIGS. 13A through 19B and comparing them to conventional interconnection layouts.

Figure 13A:
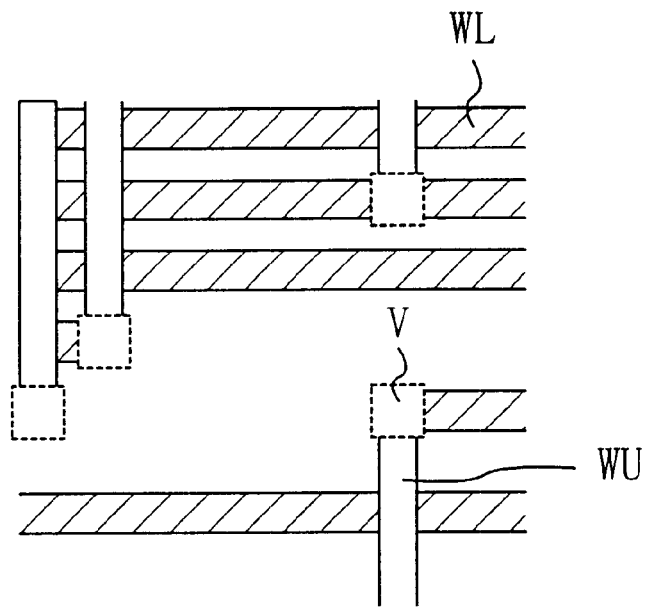
FIGS. 13A and 13B illustrate two interconnection planar layouts (with via holes interposed therebetween) for a conventional semiconductor device.
Figure 13B:
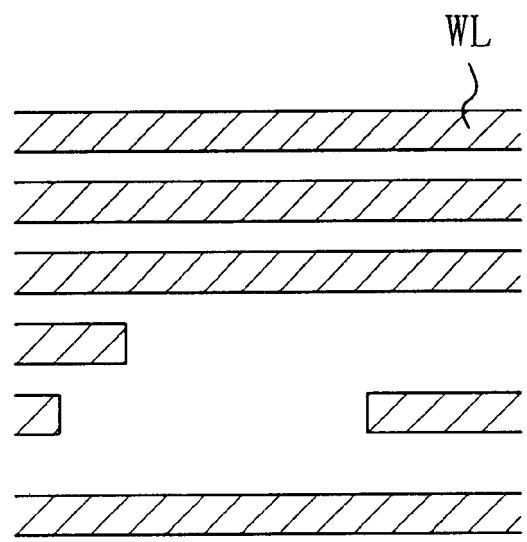
Figure 14A:
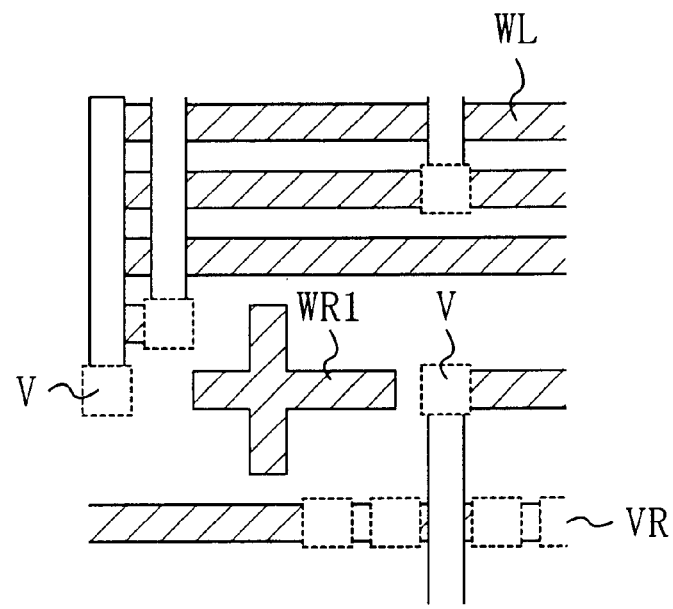
FIGS. 14A and 14B illustrate two interconnection planar layouts for a semiconductor device according to the present invention.
Figure 14B:
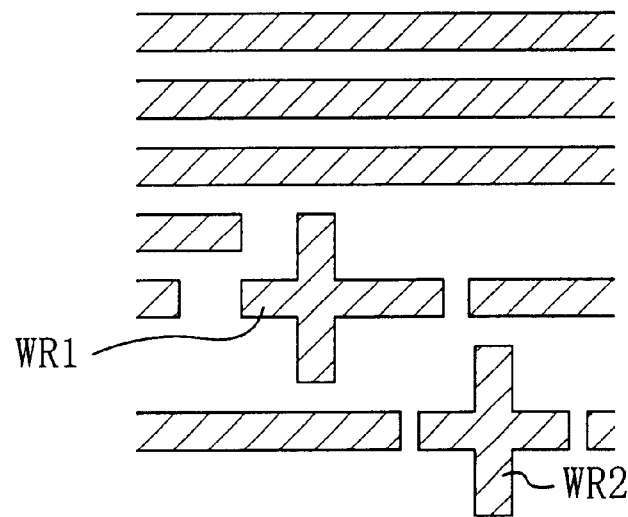

FIGS. 13A and 13B illustrate two interconnection planar layouts (with via holes interposed) for a conventional semiconductor device. FIGS. 14A and 14B illustrate two interconnection planar layouts for a semiconductor device according to the present invention. FIGS. 13A and 14A illustrate two interconnection planar layouts overlapped, while FIGS. 13B and 14B illustrate respective lower-level interconnection planar layouts.

In the conventional semiconductor device, the upper-level interconnection lines WU are connected to the lower-level interconnection lines WL at their intersections through the via holes V as shown in FIG. 13A. Also, as shown in FIG. 13B, no interconnection lines are formed in a region where no lower-level interconnection lines WL are needed. In contrast, in the semiconductor device of the present invention, redundant interconnection lines WR and redundant via holes VR are provided as shown in FIGS. 14A and 14B. As shown in FIG. 14B, the redundant interconnection line WR1 is provided in the region where no interconnection lines are provided in the conventional lower-level interconnection planar layout shown in FIG. 13B. The redundant interconnection line WR2 is formed in a region where a lower-level interconnection line WL intersects with an upper-level interconnection line WU. Specifically, the interconnection line WL, which is one continuous line in the conventional layout (FIG. 13B), is divided into two in the region where the line WL intersects with the upper-level interconnection line WU. And the redundant interconnection line WR2 is formed between these divided interconnection lines. The redundant interconnection lines WR1 and WR2 are each shaped like a cross. The upright piece of the cross is parallel to the line WU, while the transverse piece thereof is parallel to the line WL. In other words, each of the redundant interconnection lines WR1 and WR2 includes two conductor portions extending to intersect with each other (or in mutually different directions). Typically, these portions cross each other at right angles. These redundant interconnection lines WR1 and WR2 and redundant via holes VR can be formed by performing Step S1150 shown in FIG. 8, for example.

Next, it will be described with reference to FIGS. 15A through 16C why the interconnection layout can be easily modifiable when the cross-shaped redundant interconnection lines are used.

Figure 15A:
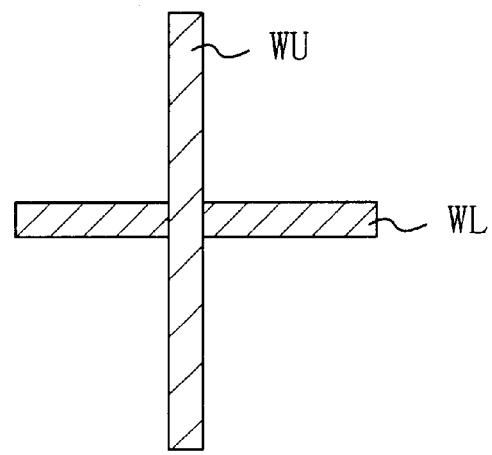
FIGS. 15A, 15B and 15C illustrate a conventional layout in which upper- and lower-level interconnection lines WU and WL intersect with each other.
Figure 15B:
Figure 15C:
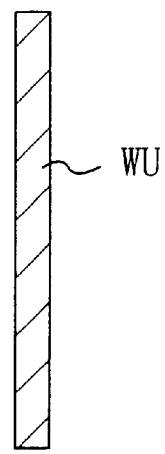
Figure 16A:
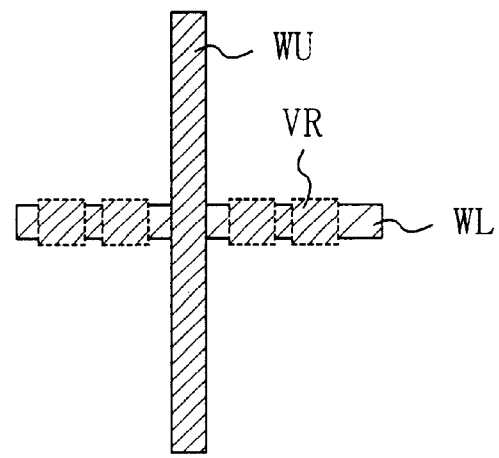
FIGS. 16A, 16B and 16C illustrate a layout of the present invention, in which upper- and lower-level interconnection lines WU and WL intersect with each other with redundant interconnection lines interposed therebetween.
Figure 16B:
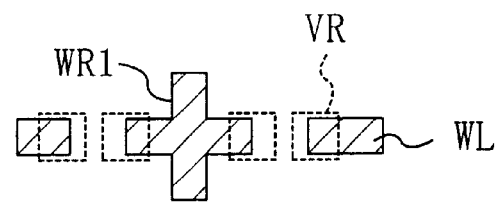
Figure 16C:
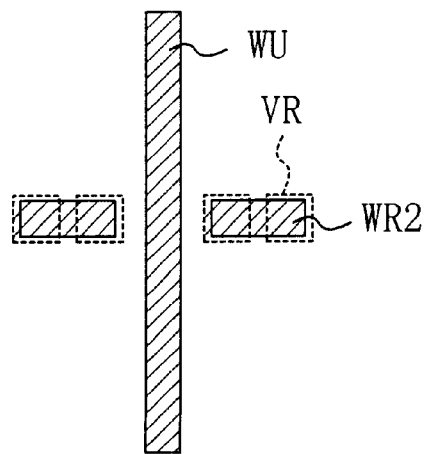

FIGS. 15A through 15C illustrate conventional layouts for two interconnection lines WL and WU intersecting with each other. FIG. 15A illustrates a layout in which these interconnection lines overlap with each other. FIG. 15B illustrates a layout for the lower-level interconnection line. And FIG. 15C illustrates a layout for the upper-level interconnection line. FIGS. 16A through 16C illustrate inventive layouts with redundant interconnection lines. FIG. 16A illustrates a layout in which these interconnection lines overlap with each other. FIG. 16B illustrates a layout for the lower-level interconnection line. And FIG. 16C illustrates a layout for the upper-level interconnection line.

As can be seen when FIG. 15B is compared to FIG. 16B, the lower-level interconnection line WL is divided into two at the intersection, and the cross-shaped redundant interconnection line WR1 is provided between these divided portions in the lower-level layout according to the present invention. On the other hand, as shown in FIG. 16C, a redundant interconnection line WR2 is provided vertically to the upper-level interconnection line WU (i.e., so as to overlap with the lower-level interconnection line WL). And by interconnecting these interconnection lines through the via holes VR as shown in FIG. 16A, two interconnection lines are formed to cross each other at right angles.

Figure 17A:
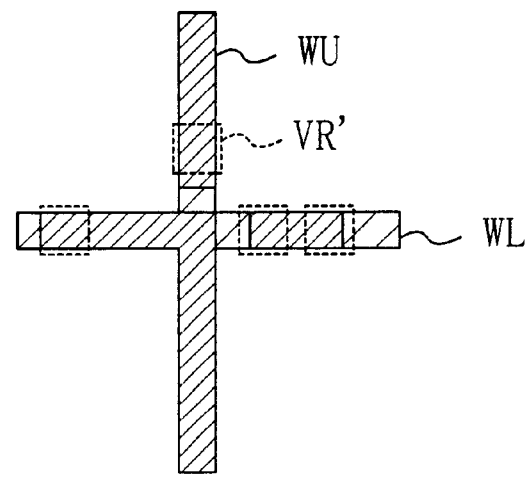
FIGS. 17A, 17B and 17C illustrate another layout of the present invention, in which upper- and lower-level interconnection lines WU and WL intersect with each other with redundant interconnection lines interposed therebetween.
Figure 17B:
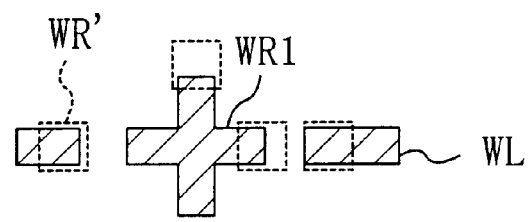
Figure 17C:
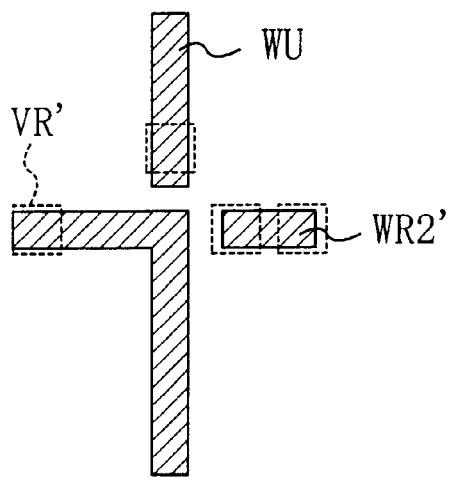

Also, by using not only the same pattern as that shown in FIG. 16B for the lower-level interconnection line WL, but also the patterns shown in FIGS. 17B and 17C for the redundant via hole VR' and upper-level interconnection line WU, interconnection lines with the pattern shown in FIG. 17A can be obtained. That is to say, only by changing the patterns for via holes and upper-level interconnection line, interconnection lines with a structure different from that shown in FIG. 16A can be obtained.

Figure 18A:
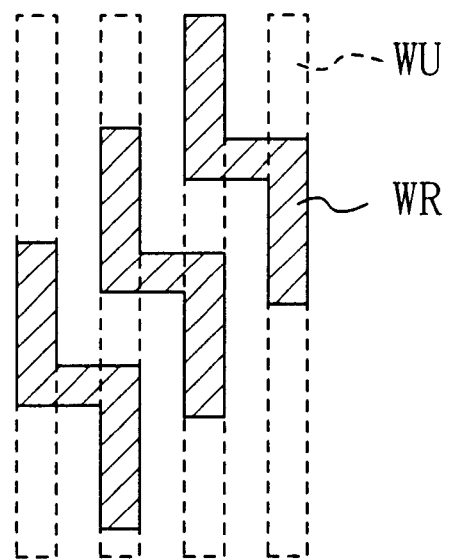
FIGS. 18A and 18B illustrate exemplary patterns for redundant interconnection lines according to the present invention.
Figure 18B:
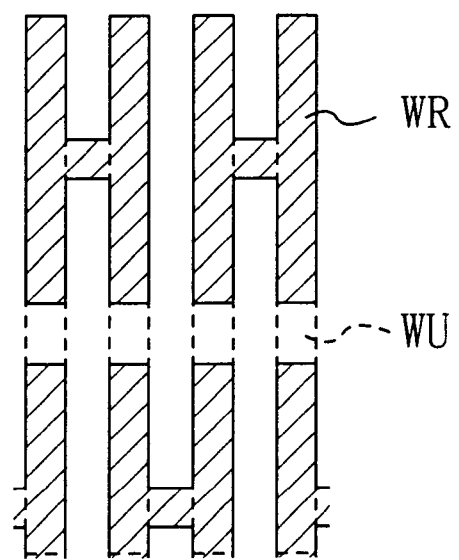

It should be noted that the pattern of a redundant interconnection line does not have to be cross-shaped, but may be of any arbitrary shape with two conductor portions intersecting with each other (typically, crossing each other at right angles). For example, S-redundant interconnection lines shown in FIG. 18A or H-redundant interconnection lines shown in FIG. 18B may also be used. Also, if these redundant interconnection lines WR are placed such that the conductor portion thereof partially overlaps with the upper-level interconnection line WU as shown in FIGS. 18A and 18B, the layout of the interconnection is easily modifiable.

Figure 19A:
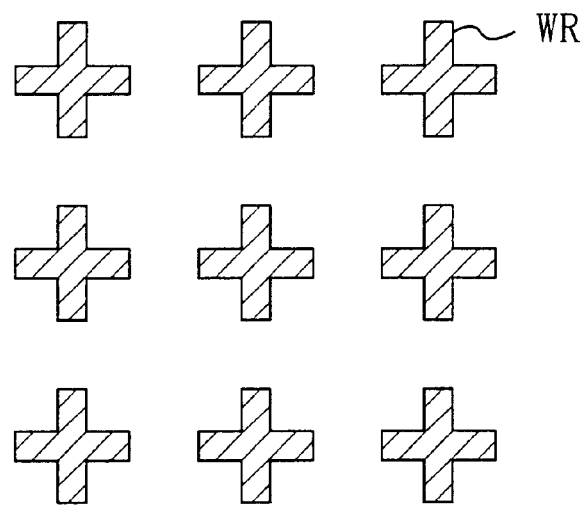
FIGS. 19A and 19B illustrate exemplary arrangements of redundant interconnection lines according to the present invention.
Figure 19B:
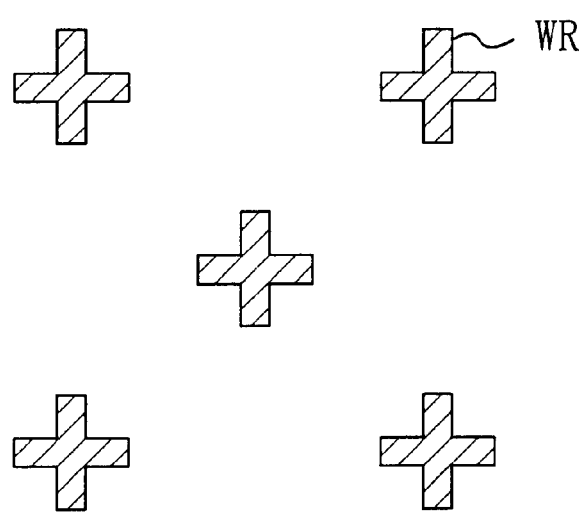
Figure 20:
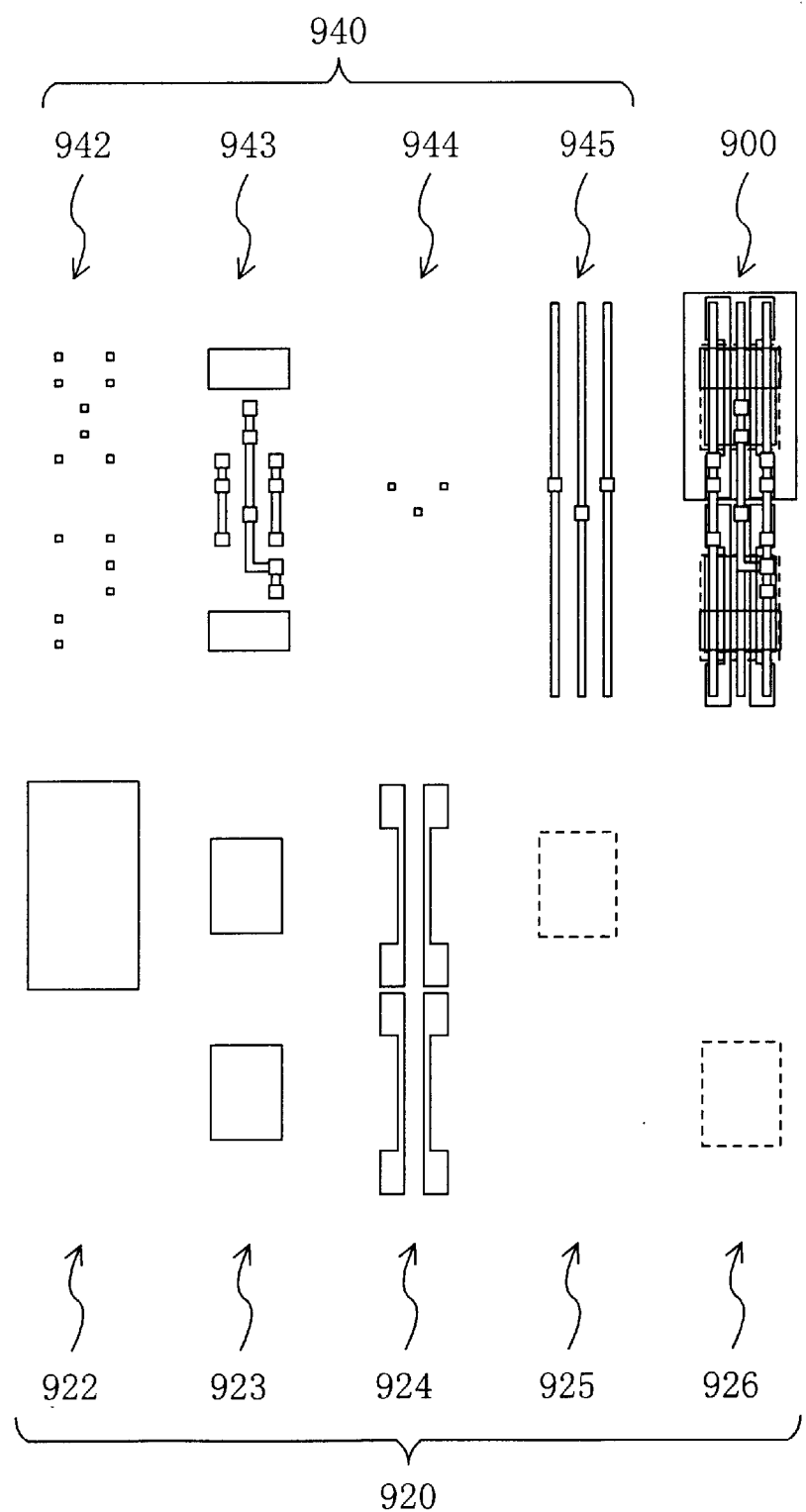
FIG. 20 is a plan view schematically illustrating a layout for a semiconductor device.
Figure 21:
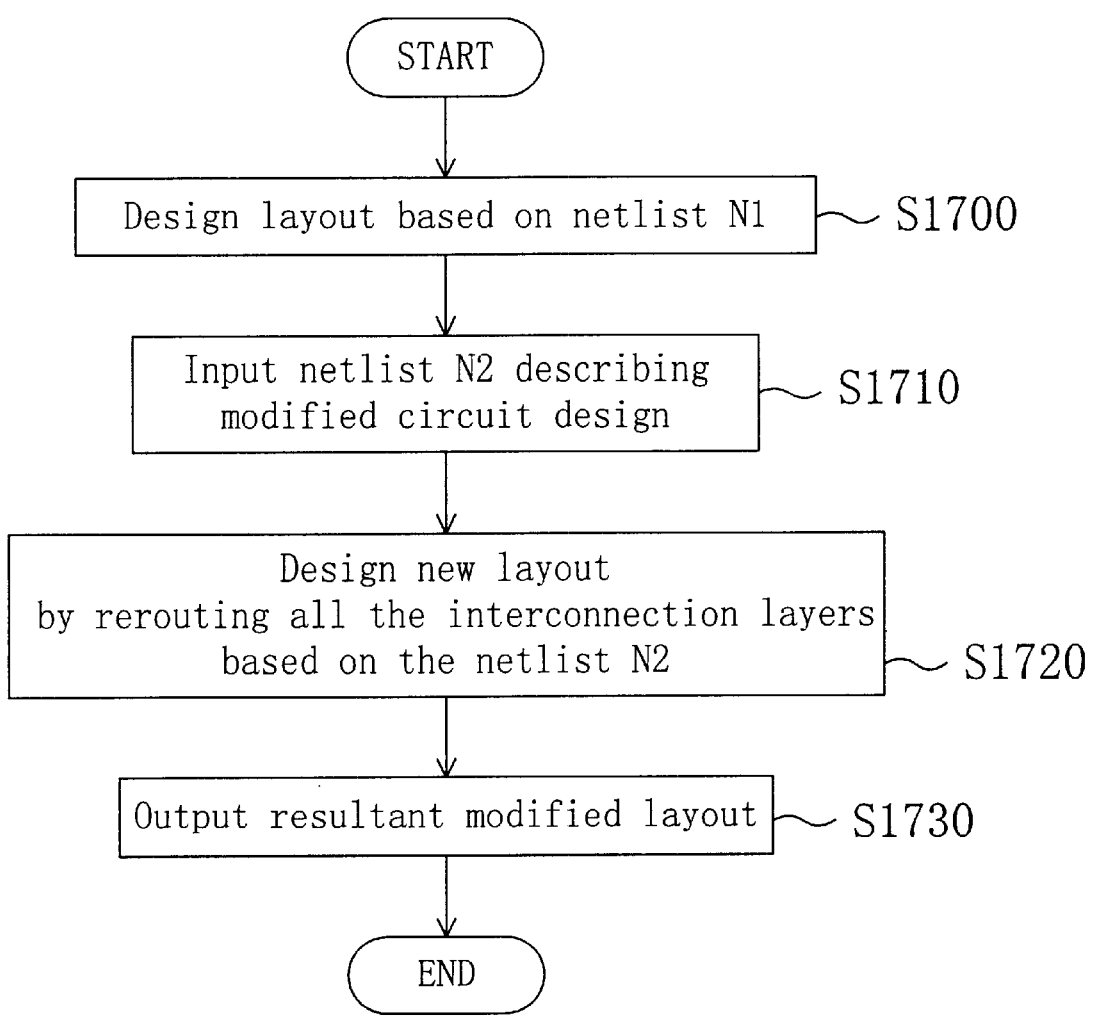
FIG. 21 is a flowchart illustrating a conventional mask designing method to cope with a change in circuit design.

In the free space of the conventional interconnection layout, these redundant interconnection lines should preferably be placed in the absence of some special reasons dictating otherwise. For example, as shown in FIGS. 19A and 19B, a plurality of cross-shaped redundant interconnection lines WR are preferably arranged to form a regular pattern. Naturally, the redundant interconnection lines WR do not have to be cross-shaped, but may be S- or H-shaped.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A method for designing a layout of a semiconductor device, comprising the steps of:
   a) preparing a first layout corresponding to a first netlist and including a component layout and a number n of, or first to $n^{th}$ (where $n \geq 2$), interconnection planar layouts to be sequentially stacked on the component layout;
   b) receiving a second netlist, which is different from the first netlist;
   c) selecting at least one of the interconnection planar layouts from the first layout, the number of the interconnection planar layouts selected being equal to or smaller than n−1; and
   d) producing a second layout, corresponding to the second netlist, by changing the physical arrangement of the at least one interconnection planar layout selected, the second layout including the component layout, the at least one interconnection planar layout with the changed arrangement, and the other interconnection planar layouts that have not been selected from the first layout.

2. The method of claim 1, further comprising, prior to the step a), the steps of:
   receiving the first netlist; and
   producing the first layout based on the first netlist,
   wherein each of the number n of interconnection planar layouts included in the first layout has a plurality of redundant interconnection patterns that are separated from each other and not included in a first interconnection structure defined by the first netlist, and
   wherein in the step d), the second layout is produced such that at least one of the redundant interconnection patterns of the interconnection planar layout selected is included in a second interconnection structure defined by the second netlist.

3. The method of claim 1, wherein the component layout defines at least one standard cell.

4. The method of claim 1, wherein the component layout defines a plurality of macroblocks.

5. The method of claim 1, wherein in the step c), one of the number n of interconnection planar layouts is selected from the first layout.

6. The method of claim 5, wherein the interconnection planar layout selected is the $n^{th}$ interconnection planar layout.

7. The method of claim 5, wherein in the step c), a $k^{th}$ (where $1 \leq k \leq n$) interconnection planar layout is selected from the number n of interconnection planar layouts belonging to the first layout, and
   wherein in the step d), if the second layout is produced with the $k^{th}$ interconnection planar layout changed, then information representing k and the second layout are output, and
   if the second layout is produced with the $k^{th}$ interconnection planar layout not changed, then the steps c) and d) are repeatedly performed by substituting k−1 for k until k becomes equal to one.

8. The method of claim 1, further comprising the steps of:
   performing the step c) for all the possible combinations;
   performing the step d) for all the possible combinations obtained in the step c); and
   outputting a second layout set including information specifying the at least one interconnection planar layout selected and the second layout corresponding to the planar layout for each of the possible combinations.

9. A computer readable storage medium having stored thereon a program executable in a computer for performing a method for designing a layout of a semiconductor device, the method comprising the steps of:
   a) preparing a first layout corresponding to a first netlist and including a component layout and a number n of, or first to $n^{th}$ (where $n \geq 2$), interconnection planar layouts to be sequentially stacked on the component layout;
   b) receiving a second netlist, which is different from the first netlist;
   c) selecting at least one of the interconnection planar layouts from the first layout, the number of the interconnection planar layouts selected being equal to or smaller than n−1; and
   d) producing a second layout, corresponding to the second netlist, by changing the physical arrangement of the at least one interconnection planar layout selected, the second layout including the component layout, the at least one interconnection planar layout with the changed arrangement, and the other interconnection planar layouts that have not been selected from the first layout.

10. A semiconductor device comprising:
    a component layer, in which a plurality of components are formed; and
    a plurality of interconnection layers, which are stacked on the component layer and in which interconnection lines for electrically connecting the components to each other are formed,
    wherein at least one of the interconnection layers includes a redundant interconnection line, which is formed in a region of the interconnection layer intersecting with an interconnection line formed in a layer overlying the interconnection layer, and which includes two conductor portions extending in such directions as intersecting with each other.

11. A semiconductor device comprising:
    a component layer, in which a plurality of components are formed; and
    a plurality of interconnection layers, which are stacked on the component layer and in which interconnection lines for electrically connecting the components to each other are formed,
    wherein a plurality of redundant interconnection lines are arranged to form a regular pattern between interconnection lines formed in at least one of the interconnection layers.

* * * * *